(12) United States Patent
Hayama et al.

(10) Patent No.: US 9,261,789 B2
(45) Date of Patent: Feb. 16, 2016

(54) LIQUID IMMERSION LITHOGRAPHY UPPER-LAYER FILM-FORMING COMPOSITION AND PHOTORESIST PATTERN-FORMING METHOD

(75) Inventors: Takahiro Hayama, Tokyo (JP); Kazunori Kusabiraki, Tokyo (JP); Yukio Nishimura, Tokyo (JP); Ken Maruyama, Tokyo (JP); Kiyoshi Tanaka, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 13/110,855

(22) Filed: May 18, 2011

(65) Prior Publication Data

US 2012/0021359 A1 Jan. 26, 2012

(30) Foreign Application Priority Data

May 18, 2010 (JP) .................. 2010-114802
Aug. 7, 2010 (JP) .................. 2010-178223

(51) Int. Cl.
| | |
|---|---|
| *G03F 7/11* | (2006.01) |
| *G03F 7/20* | (2006.01) |
| *C08F 220/24* | (2006.01) |
| *C08F 220/30* | (2006.01) |
| *C08F 220/18* | (2006.01) |
| *G03F 7/004* | (2006.01) |
| *G03F 7/039* | (2006.01) |
| *C08F 228/02* | (2006.01) |

(52) U.S. Cl.
CPC ............... *G03F 7/11* (2013.01); *C08F 220/18* (2013.01); *C08F 220/24* (2013.01); *C08F 220/30* (2013.01); *G03F 7/2041* (2013.01); *C08F 228/02* (2013.01); *G03F 7/0046* (2013.01); *G03F 7/0397* (2013.01)

(58) Field of Classification Search
None
See application file for complete search history.

(56) References Cited

U.S. PATENT DOCUMENTS

| | | | |
|---|---|---|---|
| 7,879,529 B2 | 2/2011 | Endo et al. | |
| 2007/0178405 A1 | 8/2007 | Kanda et al. | |
| 2008/0038661 A1* | 2/2008 | Chiba et al. ............... | 430/270.1 |
| 2008/0090173 A1 | 4/2008 | Harada et al. | |
| 2008/0305433 A1 | 12/2008 | Kanda et al. | |
| 2008/0311523 A1 | 12/2008 | Endo et al. | |
| 2009/0202945 A1* | 8/2009 | Nakagawa et al. ........ | 430/286.1 |
| 2010/0021852 A1 | 1/2010 | Nishimura et al. | |

FOREIGN PATENT DOCUMENTS

| | | | |
|---|---|---|---|
| CN | 101395189 | 3/2009 | |
| EP | 2078983 A1 * | 7/2009 | ............... G03F 7/11 |
| JP | 6-012452 | 1/1994 | |
| JP | 11-176727 | 7/1999 | |
| JP | 2005-264131 | 9/2005 | |
| JP | 2006-064711 | 3/2006 | |
| JP | 2006308814 A * | 11/2006 | |
| JP | 2007-304537 | 11/2007 | |
| JP | 2008-088343 | 4/2008 | |
| JP | 2008-139789 | 6/2008 | |
| TW | 200624445 | 7/2006 | |
| TW | 200832069 | 8/2008 | |
| WO | WO 2008/047678 | 4/2008 | |

OTHER PUBLICATIONS

English Translation of JP2006308814.*
Taiwanese Office Action for corresponding TW Application No. 100117399, Jan. 28, 2014.
Office Action issued Aug. 5, 2014, in Japanese Patent Application No. 2012-515914 (with English translation).
* cited by examiner

*Primary Examiner* — Cynthia H Kelly
*Assistant Examiner* — Anna Malloy
(74) *Attorney, Agent, or Firm* — Oblon, McClelland, Maier & Neustadt, L.L.P.

(57) ABSTRACT

A liquid immersion lithography upper-layer film-forming composition includes (A) a polymer that includes a structural unit (I) shown by the following formula (1), and (S) a solvent. $R^1$ in the formula (1) represents a hydrogen atom, a methyl group, or a trifluoromethyl group. The polymer (A) preferably further includes a structural unit (II) that includes a sulfo group. The polymer (A) preferably further includes a structural unit (III) shown by the following formula (3). $R^2$ in the formula (3) represents a hydrogen atom, a methyl group, or a trifluoromethyl group. $R^3$ represents a linear or branched monovalent hydrocarbon group having 1 to 12 carbon atoms or a monovalent alicyclic group having 3 to 20 carbon atoms, provided that at least one hydrogen atom of the hydrocarbon group or the alicyclic group is substituted with a fluorine atom.
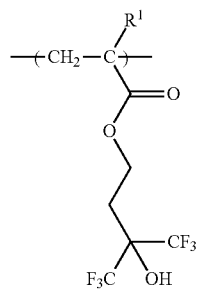
(1)
-continued
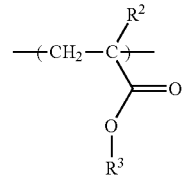
(3)
13 Claims, 2 Drawing Sheets

LIQUID IMMERSION LITHOGRAPHY UPPER-LAYER FILM-FORMING COMPOSITION AND PHOTORESIST PATTERN-FORMING METHOD

CROSS-REFERENCE TO RELATED APPLICATIONS

The present application claims priority under 35 U.S.C. §119 to Japanese Patent Application No. 2010-114802, filed May 18, 2010 and to Japanese Patent Application No. 2010-178223, filed Aug. 7, 2010. The contents of these applications are incorporated herein by reference in their entirety.

TECHNICAL FIELD

The invention relates to a liquid immersion lithography upper-layer film-forming composition and a photoresist pattern-forming method.

BACKGROUND ART

A semiconductor device production process or the like utilizes a stepping or step-and-scan projection aligner that transfers the pattern of a reticle (photomask) to each shot area of a wafer via a projection optical system, a photoresist film being formed on the wafer. The resolution of the projection optical system included in the projection aligner increases as the exposure wavelength decreases and the numerical aperture of the projection optical system increases. Therefore, a shorter exposure wavelength has been used for the projection aligner along with miniaturization of integrated circuits, and the numerical aperture of the projection optical system has been increased.

The depth of focus is also important for exposure. The resolution R and the depth of focus δ are defined by the following expressions. The depth of focus δ increases while obtaining an identical resolution R when using radiation having a shorter wavelength.

$$R = k1 \cdot \lambda/NA$$

$$\delta = k2 \cdot \lambda/NA^2$$

where, λ is the exposure wavelength, NA is the numerical aperture of the projection optical system, and k1 and k2 are process coefficients.

A projection aligner has been normally designed so that the wafer placement space is filled with air or nitrogen. The resolution R and the depth of focus δ are shown by the following expressions when the space between the wafer and the lens of the projection aligner is filled with a medium having a refractive index of n.

$$R = k1 \cdot (\lambda/n)/NA$$

$$\lambda = k2 \cdot n\lambda/NA^2$$

For example, when using water as the medium of an ArF process (the refractive index n of light having a wavelength of 193 nm in water is 1.44), the resolution R is 69.4% and the depth of focus is 144% as compared with the case of using air or nitrogen as the medium. An exposure method that utilizes such a medium is referred to as liquid immersion lithography. Liquid immersion lithography makes it possible to transfer a finer pattern using radiation having a shorter wavelength (see Japanese Patent Application Publication (KOKAI) No. 11-176727).

When using water as the medium for liquid immersion lithography, water may permeate the photoresist film formed on the wafer when the photoresist film and the lens of the projection aligner come in contact with water, so that the resolution of the photoresist film may decrease. Moreover, the components of the photoresist composition may be eluted into water, and may contaminate the surface of the lens of the projection aligner.

Therefore, a liquid immersion lithography upper-layer film (protective film) may be formed on the photoresist film in order to isolate the photoresist film from the medium (e.g., water). It is normally desired that the liquid immersion lithography upper-layer film exhibits sufficient transmittance at the wavelength of radiation, can be formed on the photoresist film without being intermixed with the photoresist film, is not eluted into the medium (e.g., water) (i.e., is stable), and is not easily dissolved in the developer (e.g., alkaline solution) (see Japanese Patent Application Publication (KOKAI) No. 2005-264131, Japanese Patent Application Publication (KOKAI) No. 2006-64711, and Japanese Patent Application Publication (KOKAI) No. 2008-139789).

When using a scan-type liquid immersion lithography system, the immersion medium may not follow the movement of the lens, so that watermark defects (i.e., waterdrops remain on the exposed photoresist film) may occur. This may make it difficult to increase the scan speed, so that the production efficiency may decrease. A liquid immersion lithography upper-layer film-forming composition that contains a polymer that exhibits high water repellency (hydrophobicity) has been known (WO08/047,678). However, since a liquid immersion lithography upper-layer film that exhibits high hydrophobicity exhibits low solubility in the developer, bridge defects (i.e., the lines of a line-and-space pattern are connected in the top area) may occur due to undissolved residues of the liquid immersion lithography upper-layer film.

RELATED-ART DOCUMENT

Patent Document

[Patent Document 1] Japanese Patent Application Publication (KOKAI) No. 11-176727
[Patent Document 2] Japanese Patent Application Publication (KOKAI) No. 2005-264131
[Patent Document 3] Japanese Patent Application Publication (KOKAI) No. 2006-64711
[Patent Document 4] Japanese Patent Application Publication (KOKAI) No. 2008-139789
[Patent Document 5] WO08/047,678

SUMMARY OF THE INVENTION

Problems to be Solved by the Invention

The invention was conceived in view of the above situation. An object of the invention is to provide a liquid immersion lithography upper-layer film-forming composition that can form a liquid immersion lithography upper-layer film that exhibits moderate water repellency and high solubility in a developer, and can suppress occurrence of various defects such as watermark defects and bridge defects even if a high scan speed is employed.

Means for Solving the Problems

According to one aspect of the invention, a liquid immersion lithography upper-layer film-forming composition includes (A) a polymer that includes a structural unit (I)

shown by a formula (1) (hereinafter may be referred to as "polymer (A)"), and (S) a solvent,

[Chemical Formula 1]

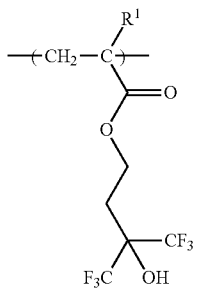

(1)

wherein $R^1$ represents a hydrogen atom, a methyl group, or a trifluoromethyl group.

The polymer (A) preferably further includes a structural unit (II) that includes a sulfo group.

The polymer (A) preferably further includes a structural unit (III) shown by a formula (3),

[Chemical Formula 2]

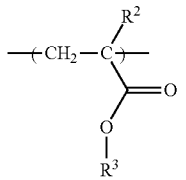

(3)

wherein $R^2$ represents a hydrogen atom, a methyl group, or a trifluoromethyl group, and $R^3$ represents a linear or branched monovalent hydrocarbon group having 1 to 12 carbon atoms or a monovalent alicyclic group having 3 to 20 carbon atoms, provided that at least one hydrogen atom of the hydrocarbon group or the alicyclic group is substituted with a fluorine atom.

The polymer (A) preferably further includes a structural unit (IV) shown by a formula (4),

[Chemical Formula 3]

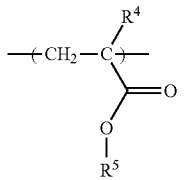

(4)

wherein $R^4$ represents a hydrogen atom, a methyl group, or a trifluoromethyl group, and $R^5$ represents a linear or branched monovalent hydrocarbon group having 1 to 12 carbon atoms or a monovalent alicyclic group having 3 to 20 carbon atoms.

The liquid immersion lithography upper-layer film-forming composition preferably further includes (B) a polymer that includes the structural units (I) and (III), and has a fluorine atom content higher than that of the polymer (A) (hereinafter may be referred to as "polymer (B)").

The polymer (B) preferably further includes the structural unit (IV).

According to another aspect of the invention, a photoresist pattern-forming method includes (1) applying a photoresist composition to a substrate to form a photoresist film, (2) applying the liquid immersion lithography upper-layer film-forming composition to the photoresist film to form a liquid immersion lithography upper-layer film, (3) exposing the photoresist film and the liquid immersion lithography upper-layer film via an immersion medium and a mask having a given pattern, the immersion medium being disposed between the liquid immersion lithography upper-layer film and a lens, and (4) developing the photoresist film and the liquid immersion lithography upper-layer film that have been exposed.

Effect of the Invention

The liquid immersion lithography upper-layer film-forming composition can thus form a liquid immersion lithography upper-layer film that exhibits moderate water repellency and high solubility in a developer, and can suppress occurrence of various defects such as watermark defects and bridge defects even if a high scan speed is employed.

DESCRIPTION OF EMBODIMENTS

Liquid Immersion Lithography Upper-Layer Film-Forming Composition

Figure 1:
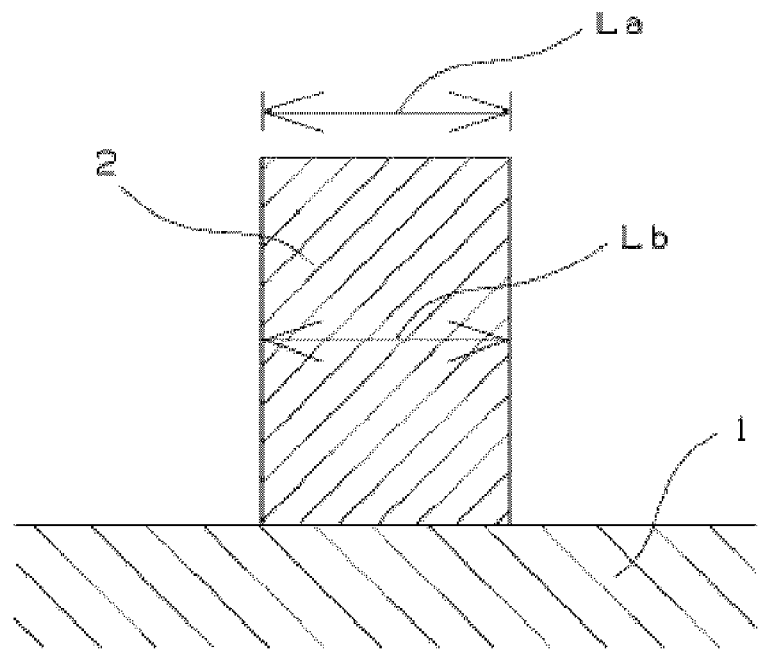
FIG. 1 is a cross-sectional view schematically showing the shape of a line-and-space pattern.

A liquid immersion lithography upper-layer film-forming composition according to one embodiment of the invention is used to form a liquid immersion lithography upper-layer film on the surface of a photoresist film formed using a photoresist composition, and includes the polymer (A) and the solvent (S). The liquid immersion lithography upper-layer film-forming composition may preferably further include the polymer (B). The liquid immersion lithography upper-layer film-forming composition may further include an additional polymer and an optional component as long as the effects of the invention are not impaired. Each component is described in detail below.

Polymer (A)

The polymer (A) includes a structural unit (I) shown by the formula (1). When the liquid immersion lithography upper-layer film-forming composition includes the polymer (A) that includes the structural unit (I), the resulting liquid immersion lithography upper-layer film exhibits moderate water repellency and solubility in a developer. Therefore, a photoresist film can be protected during liquid immersion lithography (i.e., the photoresist film exhibits stability, and is not eluted into a medium (e.g., water)), and defects (e.g., watermark defects, bubble defects, pattern defects, and bridge defects)

can be effectively suppressed, so that a high-resolution resist pattern can be formed. It is preferable that the polymer (A) further include structural units (II), (III), and (IV). The polymer (A) may include two or more types of each structural unit. Each structural unit is described in detail below.

Structural Unit (I)

The structural unit (I) is shown by the formula (1). $R^1$ in the formula (1) represents a hydrogen atom, a methyl group, or a trifluoromethyl group. It is preferable to use (1,1,1-trifluoro-2-trifluoromethyl-2-hydroxy-4-butyl) (meth)acrylate as a monomer that produces the structural unit (I).

The content of the structural unit (I) in the polymer (A) is preferably 20 to 99 mol % based on the total structural units included in the polymer (A). If the content of the structural unit (I) is within the above range, a situation in which the liquid immersion lithography upper-layer film undergoes bridge defects can be further suppressed.

Structural Unit (II)

The structural unit (II) includes a sulfo group. Examples of the structural unit (II) include structural units shown by the following formulas (2-1) and (2-2), and the like.

[Chemical Formula 4]

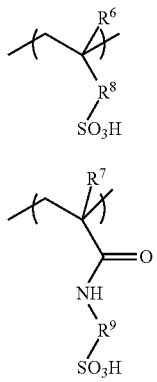

(2-1)

(2-2)

wherein $R^6$ and $R^7$ individually represent a hydrogen atom, a methyl group, or a trifluoromethyl group, and $R^8$ and $R^9$ individually represent a single bond, a linear or branched divalent hydrocarbon group having 1 to 6 carbon atoms, a divalent alicyclic group having 4 to 12 carbon atoms, or a divalent aromatic hydrocarbon group having 6 to 12 carbon atoms.

Examples of the linear or branched divalent hydrocarbon group having 1 to 6 carbon atoms represented by $R^8$ and $R^9$ include a methylene group, an ethylene group, a 1,3-propylene group, a 1,2-propylene group, a tetramethylene group, a pentamethylene group, a hexamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, and the like.

Examples of the divalent alicyclic group having 4 to 12 carbon atoms represented by $R^8$ and $R^9$ include a monocyclic hydrocarbon group, a bridged cyclic hydrocarbon group, and the like. Examples of the monocyclic hydrocarbon group include a cyclobutylene group (e.g., 1,3-cyclobutylene group), a cyclopentylene group (e.g., 1,3-cyclopentylene group), a cyclohexylene group (e.g., 1,4-cyclohexylene group), a cyclooctylene group (e.g., 1,5-cyclooctylene group)), and the like. Examples of the bridged cyclic hydrocarbon group include a norbornylene group (e.g., 1,4-norbornylene group and 2,5-norbornylene group), an adamantylene group (e.g., 1,5-adamantylene group and 2,6-adamantylene group), and the like.

Examples of the divalent alicyclic group having 6 to 12 carbon atoms represented by $R^8$ and $R^9$ include a phenylene group, a tolylene group, and the like.

$R^8$ in the formula (2-1) preferably represents a single bond, a linear or branched divalent hydrocarbon group having 1 to 6 carbon atoms, or a divalent aromatic hydrocarbon group having 6 to 12 carbon atoms, and more preferably represents a single bond, a methylene group, or a phenylene group. $R^9$ in the formula (2-2) preferably represents the linear or branched divalent hydrocarbon group having 1 to 6 carbon atoms, and more preferably represents a 2-methylpropane-2,3-diyl group.

The structural unit (II) is preferably any of the structural units shown by the following formulas.

[Chemical Formula 5]

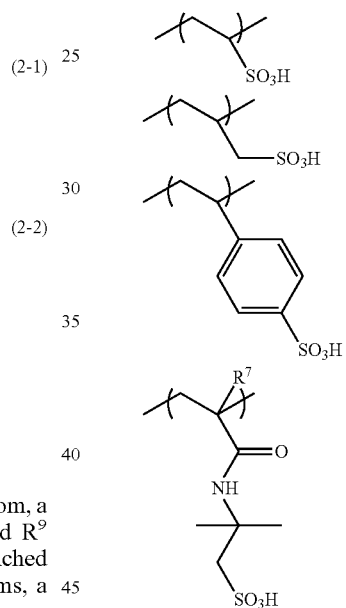

wherein $R^7$ is the same as defined for the formula (2-2).

The content of the structural unit (II) in the polymer (A) is preferably 1 to 20 mol % based on the total structural units included in the polymer (A). If the content of the structural unit (II) is within the above range, a situation in which the liquid immersion lithography upper-layer film undergoes bridge defects can be further suppressed.

Structural Unit (III)

The structural unit (III) is shown by the formula (3). $R^2$ in the formula (3) represents a hydrogen atom, a methyl group, or a trifluoromethyl group. $R^3$ in the formula (3) represents a linear or branched monovalent hydrocarbon group having 1 to 12 carbon atoms or a monovalent alicyclic group having 3 to 20 carbon atoms. At least one hydrogen atom of the hydrocarbon group or the alicyclic group is substituted with a fluorine atom.

$R^3$ preferably represents a saturated chain-like hydrocarbon group (e.g., methyl group, ethyl group, 1,3-propyl group, 1,2-propyl group, butyl group, pentyl group, hexyl group, heptyl group, octyl group, nonyl group, decyl group, 1-methyl-1,3-propyl group, 2-methyl-1,3-propyl group, 2-methyl-1,2-propyl group, 1-methyl-1,4-butyl group, or 2-methyl-1,4-butyl group), a monocyclic hydrocarbon group (e.g., 1,3-cyclobutyl group, 1,3-cyclopentyl group, 1,4-cyclohexyl group, or 1,5-cyclooctyl group), or a partial fluorinated group or a perfluoroalkyl group of a polycyclic hydrocarbon group (e.g., 1,4-norbornyl group, 2,5-norbornyl group, 1,5-adamantyl group, or 2,6-adamantyl group).

Examples of the structural unit (III) include the structural units disclosed in Japanese Patent Application Publication (KOKAI) No. 2007-304537, the structural units disclosed in Japanese Patent Application Publication (KOKAI) No. 2008-088343, structural units shown by the following formulas, and the like.

[Chemical Formula 6]

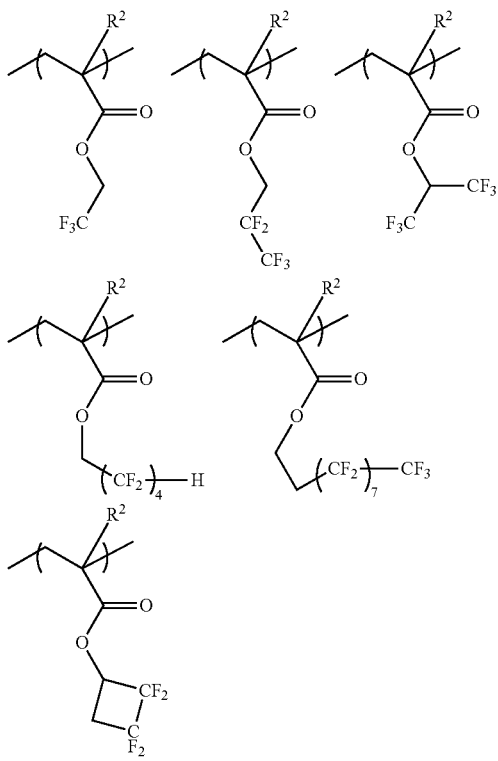

wherein $R^2$ is the same as defined for the formula (3).

Examples of a preferable monomer that produces the structural unit (III) include trifluoromethyl (meth)acrylate, 2,2,2-trifluoroethyl (meth)acrylate, perfluoroethyl (meth)acrylate, perfluoro-n-propyl (meth)acrylate, perfluoro-1-propyl (meth)acrylate, perfluoro-n-butyl (meth)acrylate, perfluoro-1-butyl (meth)acrylate, perfluoro-t-butyl (meth)acrylate, 2-(1,1,1,3,3,3-hexafluoropropyl) (meth)acrylate, 1-(2,2,3,3,4,4,5,5-octafluoropentyl) (meth)acrylate, perfluorocyclohexylmethyl (meth)acrylate, 1-(2,2,3,3,3-pentafluoropropyl) (meth)acrylate, 1-(3,3,4,4,5,5,6,6,7,7,8,8,9,9,10,10,10-heptadecafluorodecyl) (meth)acrylate, 1-(5-trifluoromethyl-3,3,4,4,5,6,6,6-octafluorohexyl) (meth)acrylate, and the like.

The content of the structural unit (III) in the polymer (A) is preferably 5 to 70 mol % based on the total structural units included in the polymer (A). If the content of the structural unit (III) is within the above range, a situation in which the liquid immersion lithography upper-layer film undergoes bridge defects or bubble defects can be further suppressed.

Structural Unit (IV)

The structural unit (IV) is shown by the formula (4). $R^4$ in the formula (4) represents a hydrogen atom, a methyl group, or a trifluoromethyl group. $R^5$ in the formula (4) represents a linear or branched monovalent hydrocarbon group having 1 to 12 carbon atoms or a monovalent alicyclic group having 3 to 20 carbon atoms.

$R^5$ preferably represents a methyl group, an ethyl group, a 1,3-propyl group, a 1,2-propyl group, a tetramethyl group, a pentamethyl group, a hexamethyl group, a heptamethyl group, an octamethyl group, a nonamethyl group, a decamethyl group, a 1-methyl-1,3-propyl group, a 2-methyl-1,3-propyl group, a 2-methyl-1,2-propyl group, a 1-methyl-1,4-butyl group, a 2-methyl-1,4-butyl group, a methylidyne group, an ethylidene group, a propylidene group, a 2-propylidene group, a 1,3-cyclobutyl group, a 1,3-cyclopentyl group, a 1,4-cyclohexyl group, a 1,5-cyclooctyl group, a 1,4-norbornyl group, a 2,5-norbornyl group, a 1,5-adamantyl group, or a 2,6-adamantyl group.

Examples of a monomer that produces the structural unit (IV) include methyl methacrylate, ethyl methacrylate, butyl methacrylate, pentyl methacrylate, cyclohexyl methacrylate, adamantyl methacrylate, dicyclopentyl methacrylate, and the like.

The content of the structural unit (IV) in the polymer (A) is preferably 5 to 55 mol % based on the total structural units included in the polymer (A). If the content of the structural unit (IV) is within the above range, a situation in which the liquid immersion lithography upper-layer film undergoes bridge defects or bubble defects can be further suppressed.

Structural Unit (V)

The polymer (A) may further include a structural unit (V) as an additional structural unit as long as the effects of the invention are not impaired.

Examples of the structural unit (V) include structural units shown by the following formulas (5-1) and (5-2), and the like.

[Chemical Formula 7]

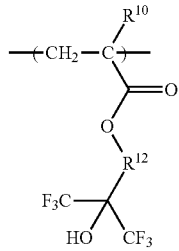

(5-1)

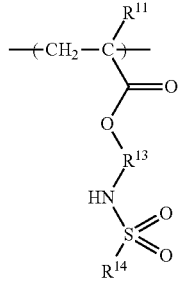

(5-2)

wherein $R^{10}$ and $R^{11}$ represent a hydrogen atom, a methyl group, or a trifluoromethyl group, $R^{12}$ represents a single bond, a linear or branched alkanediyl group having 1 to 6 carbon atoms (excluding a 1,2-ethylene group), or a divalent alicyclic group having 4 to 12 carbon atoms, $R^{13}$ represents a single bond, a linear or branched alkanediyl group having 1 to 6 carbon atoms, or a divalent alicyclic group having 4 to 12 carbon atoms, and $R^{14}$ represents a linear or branched hydrocarbon group having 1 to 10 carbon atoms or a monovalent alicyclic group having 3 to 10 carbon atoms, provided that at least one hydrogen atom of the hydrocarbon group or the alicyclic group is substituted with a fluorine atom.

$R^{12}$ and $R^{13}$ preferably represent a methylene group, a 1,1-ethylene group, a 1,3-propylene group, a 1,2-propylene, a tetramethylene group, a pentamethylene group, a hexamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, a 1,3-cyclobutylene, a 1,3-cyclopentylene, a 1,4-cyclohexylene group, a 1,5-cyclooctylene group, a 1,4-norbornylene group, a 2,5-norbornylene group, a 1,5-adamantylene group, or a 2,6-adamantylene group.

When $R^{12}$ represents a divalent alicyclic group, it is preferable that an alkanediyl group having 1 to 4 carbon atoms be inserted between the bistrifluoromethylhydroxymethyl group and the alicyclic hydrocarbon group as a spacer. $R^{12}$ preferably represents a hydrocarbon group including a 2,5-norbornylene group or a propylene group.

$R^{14}$ preferably represents a trifluoromethyl group.

Examples of a preferable monomer that produces the repeating unit (V) include (1,1,1-trifluoro-2-trifluoromethyl-2-hydroxy-3-propyl) (meth)acrylate, (1,1,1-trifluoro-2-trifluoromethyl-2-hydroxy-4-pentyl) (meth)acrylate, 2-{[5-(1',1',1'-trifluoro-2'-trifluoromethyl-2'-hydroxy)propyl]bicyclo[2.2.1]heptyl}(meth)acrylate, 3-{[8-(1',1',1'-trifluoro-2'-trifluoromethyl-2'-hydroxy)propyl]tetracyclo[6.2.1.1$^{3,6}$.0$^{2,7}$]dodecyl}(meth)acrylate, (((trifluoromethyl)sulfonyl)amino)ethyl-1-methacrylate, and 2-(((trifluoromethyl) sulfonyl)amino)ethyl-1-acrylate.

The content of the polymer (A) in the liquid immersion lithography upper-layer film-forming composition is preferably 20 mass % or more, more preferably 40 mass % or more, and particularly preferably 60 mass % or more, based on the total amount (=100 mass %) of the polymer component. If the content of the polymer (A) is less than 20 mass %, defects may occur.

Polymer (B)

The liquid immersion lithography upper-layer film-forming composition may further include the polymer (B) that includes at least one structural unit selected from the structural units (I) and (V), and the structural unit (III), and has a fluorine atom content higher than that of the polymer (A). If the content of the structural units (I) and (V) is within the above range, the resulting liquid immersion lithography upper-layer film has a sufficiently high receding contact angle, and occurrence of defects can be suppressed. Since the polymer (B) has a fluorine atom content higher than that of the polymer (A), the polymer (B) exhibits excellent water repellency as compared with the polymer (A). Specifically, when the liquid immersion lithography upper-layer film-forming composition further includes the polymer (B), the polymer (B) is distributed in the surface area, so that occurrence of watermark defects due to remaining droplets can be prevented while maintaining the receding contact angle.

It is preferable that the polymer (B) further include the structural unit (IV). The description given above in connection with the polymer (A) may be applied to the structural units (I), (III), (IV), and (V). The polymer (B) may include two or more types of each structural unit.

The content of at least one structural unit selected from the structural units (I) and (V) in the polymer (B) is preferably 20 to 80 mol % based on the total structural units included in the polymer (B). The content of the structural unit (III) in the polymer (B) is preferably 5 to 80 mol % based on the total structural units included in the polymer (B). If the content of the structural unit (I) and the content of the structural unit (III) are within the above range, the resulting liquid immersion lithography upper-layer film has a sufficiently high receding contact angle, and occurrence of defects can be suppressed. The content of the structural unit (IV) in the polymer (B) is preferably 5 to 55 mol %, and more preferably 5 to 50 mol %, based on the total structural units included in the polymer (B). If the content of the structural unit (IV) is within the above range, the receding contact angle and the advancing contact angle of the liquid immersion lithography upper-layer film are well-balanced.

The content of the polymer (B) in the liquid immersion lithography upper-layer film-forming composition is preferably 60 mass % or less, more preferably 50 mass % or less, and particularly preferably 40 mass % or less, based on the total amount (=100 mass %) of the polymer component. If the content of the polymer (B) exceeds 60 mass %, defects may occur.

Additional Polymer

The liquid immersion lithography upper-layer film-forming composition may further include an additional polymer other than the polymers (A) and (B) as long as the effects of the invention are not impaired. Examples of the additional polymer include (i) a polymer that includes the structural units (V) and (II), (ii) a polymer that includes a structural unit (VI) (described later) and the structural unit (II), and the like. The description given above in connection with the polymer (A) may be applied to the structural units (II), (III), and (V).

The content of the structural unit (V) in the polymer (i) is preferably 20 to 99 mol %, and more preferably 30 to 99 mol %, based on the total structural units included in the polymer (i). If the content of the structural unit (V) is within the above range, occurrence of bridge defects can be suppressed. The content of the structural unit (II) in the polymer (i) is preferably 1 to 20 mol %, and more preferably 1 to 15 mol %, based on the total structural units included in the polymer (i). If the content of the structural unit (II) is within the above range, occurrence of blob defects can be suppressed.

Structural Unit (VI)

Examples of the structural unit (VI) include structural units shown by the following formulas (6-1), (6-2), and (6-3), and the like.

[Chemical Formula 8]

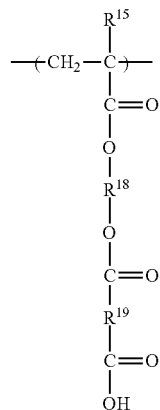

(6-1)

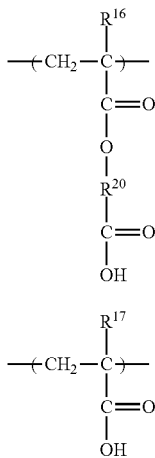

(6-2)

(6-3)

wherein $R^{15}$, $R^{16}$, and $R^{17}$ individually represent a hydrogen atom, a methyl group, or a trifluoromethyl group, and $R^{18}$, $R^{19}$, and $R^{20}$ individually represent a linear or branched divalent hydrocarbon group having 1 to 6 carbon atoms or a divalent alicyclic group having 4 to 12 carbon atoms.

Examples of the linear or branched divalent hydrocarbon group having 1 to 6 carbon atoms represented by $R^{18}$, $R^{19}$, and $R^{20}$ include an ethylene group, a 1,3-propylene group, a 1,2-propylene group, a tetramethylene group, a pentamethylene group, a hexamethylene group, a 1-methyl-1,3-propylene group, a 2-methyl-1,3-propylene group, a 2-methyl-1,2-propylene group, a 1-methyl-1,4-butylene group, a 2-methyl-1,4-butylene group, and the like.

Examples of the divalent alicyclic group having 4 to 12 carbon atoms represented by $R^{18}$, $R^{19}$, and $R^{20}$ include an arylene group (e.g., phenylene group and tolylene group), a cyclobutylene group (e.g., 1,3-cyclobutylene group), a cyclopentylene group (e.g., 1,3-cyclopentylene group), a cyclohexylene group (e.g., 1,4-cyclohexylene group), a cyclooctylene group (e.g., 1,5-cyclooctylene group), a norbornylene group (e.g., 1,4-norbornylene group and 2,5-norbornylene group), and an adamantylene group (e.g., 1,5-adamantylene group and 2,6-adamantylene group).

Examples of a monomer that produces the structural unit (VI) include 2-methacryloyloxyethyl hexahydrophthalate, 3-methacryloyloxypropyl hexahydrophthalate, 4-methacryloyloxybutyl hexahydrophthalate, 2-methacryloyloxy cyclohexacarboxylate, 3-methacryloyloxy propylcarboxylate, (meth)acrylic acid, and the like.

When the liquid immersion lithography upper-layer film-forming composition includes the polymer (ii) that includes the structural unit (VI), occurrence of blob defects can be further suppressed.

The content of the structural unit (VI) in the polymer (ii) is preferably 20 to 99 mol %, and more preferably 30 to 99 mol %, based on the total structural units included in the polymer (ii). If the content of the structural unit (VI) is less than 20 mol %, the polymer may remain undissolved due to a decrease in solubility in an alkaline developer. If the content of the structural unit (VI) exceeds 99 mol %, the polymer may exhibit poor solubility in the solvent. The content of the structural unit (II) in the polymer (ii) is preferably 1 to 20 mol %, and more preferably 1 to 15 mol %, based on the total structural units included in the polymer (ii). If the content of the structural unit (II) is within the above range, occurrence of blob defects can be suppressed.

Examples of a monomer that produces an additional structural unit that may be included in a polymer other than the polymers (i) and (ii) include dicarboxylic diesters such as diethyl maleate, diethyl fumarate, and diethyl itaconate; aryl (meth)acrylates such as phenyl (meth)acrylate and benzyl (meth)acrylate; aromatic vinyls such as styrene, α-methylstyrene, m-methylstyrene, p-methylstyrene, vinyltoluene, and p-methoxystyrene; nitrile group-containing radically polymerizable monomers such as acrylonitrile and methacrylonitrile; amide bond-containing radically polymerizable monomers such as acrylamide and methacrylamide; fatty acid vinyl esters such as vinyl acetate; chlorine-containing radically polymerizable monomers such as vinyl chloride and vinylidene chloride; conjugated diolefins such as 1,3-butadiene, isoprene, and 1,4-dimethylbutadiene; and the like. The content of the additional structural unit is preferably 50 mol % or less, and more preferably 40 mol % or less, based on the total structural units included in the polymer.

Synthesis of Polymer

Each polymer may be synthesized by radically polymerizing a monomer that produces each structural unit in a polymerization solvent in the presence of an initiator and a chain transfer agent, for example.

Examples of the polymerization solvent include alcohols, cyclic ethers, alkyl ethers of polyhydric alcohols, alkyl ether acetates of polyhydric alcohols, aromatic hydrocarbons, ketones, and esters. Among these, cyclic ethers, polyhydric alcohol alkyl ethers, polyhydric alcohol alkyl ether acetates, ketones, esters, and the like are preferable.

The polystyrene-reduced weight average molecular weight (Mw) of each polymer determined by gel permeation chromatography (GPC) is preferably 2000 to 100,000, and more preferably 2500 to 50,000. If the Mw of each polymer is within the above range, the resulting liquid immersion lithography upper-layer film exhibits good water resistance, mechanical properties, and solubility in the solvent. The molecular weight distribution (Mw/Mn) of each polymer is preferably 1 to 5, and more preferably 1 to 3.

Note that the Mw and Mn refer to values determined by GPC under the following conditions.

System: HLC-8120 (manufactured by Tosoh Corporation)
Column: G2000H$_{XL}$×2, G3000H$_{XL}$×1, G4000H$_{XL}$×1 (manufactured by Tosoh Corporation)
Eluant: tetrahydrofuran
Column temperature: 40° C.
Flow rate: 1.0 ml/min
Standard: monodisperse polystyrene The polymer component included in the liquid immersion lithography upper-layer film-forming composition is a resin that can form a liquid immersion lithography upper-layer film that is stable to an immersion medium during exposure to radiation, and can be dissolved in a developer used to form a resist pattern. The expression "stable to an immersion medium" used herein means that a change in thickness measured by a stability evaluation test is within 3% of the initial thickness. The stability evaluation test is performed as follows. Specifically, the liquid immersion lithography upper-layer film-forming composition is spin-coated onto an 8-inch silicon wafer using a coater/developer ("CLEAN TRACK ACT 8" manufactured by Tokyo Electron Ltd.), and pre-baked at 90° C. for 60 seconds to form a liquid immersion lithography upper-layer film having a thickness of 90 nm. The initial thickness of the liquid immersion lithography upper-layer film is measured using a spectroscopic film thickness measurement system ("Lambda Ace VM-2010" manufactured by Dainippon Screen Mfg. Co., Ltd.). Ultrapure water is discharged (60 seconds) to the surface of the wafer on which the liquid immersion lithography upper-layer film is formed through the rinse nozzle of the coater/developer, and the wafer is spin-dried at 4000 rpm for 15 seconds. The thickness of the upper-layer film is again measured, and a change in thickness of the upper-layer film is calculated. When a decrease in thickness of the upper-layer film is within 3% of the initial thickness, the liquid immersion lithography upper-layer film is determined to be stable to the immersion medium. The expression "can be dissolved in a developer" means that the upper-layer film is removed so that no residue is observed on the resist pattern with the naked eye after development using an alkaline aqueous solution.

Solvent (S)

The liquid immersion lithography upper-layer film-forming composition according to one embodiment of the invention includes the solvent (S) that dissolves the polymer component. The solvent (S) is preferably a solvent that does not cause a deterioration in lithographic performance (e.g., due to intermixing with the photoresist film) when applied to the photoresist film.

Examples of the solvent (S) include monohydric alcohols, polyhydric alcohols, polyhydric alcohol alkyl ethers, polyhydric alcohol alkyl ether acetates, ethers, cyclic ethers, higher hydrocarbons, aromatic hydrocarbons, ketones, esters, water, and the like.

Examples of monohydric alcohols include 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and the like.

Examples of polyhydric alcohols include ethylene glycol, propylene glycol, and the like.

Examples of polyhydric alcohol alkyl ethers include ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, dipropylene glycol dimethyl ether, propylene glycol monomethyl ether, propylene glycol monoethyl ether, propylene glycol mono-n-propyl ether, ethylene glycol monoisobutyl ether, and the like.

Examples of polyhydric alcohol alkyl ether acetates include ethylene glycol ethyl ether acetate, diethylene glycol ethyl ether acetate, propylene glycol ethyl ether acetate, propylene glycol monomethyl ether acetate, and the like.

Examples of ethers include dipropyl ether, diisopropyl ether, butyl methyl ether, butyl ethyl ether, butyl propyl ether, dibutyl ether, diisobutyl ether, tert-butyl methyl ether, tert-butyl ethyl ether, tert-butyl propyl ether, di-tert-butyl ether, dipentyl ether, diisoamyl ether, cyclopentyl methyl ether, cyclohexyl methyl ether, cyclopentyl ethyl ether, cyclohexyl ethyl ether, cyclopentyl propyl ether, cyclopentyl 2-propyl ether, cyclohexyl propyl ether, cyclohexyl 2-propyl ether, cyclopentyl butyl ether, cyclopentyl tert-butyl ether, cyclohexyl butyl ether, cyclohexyl tert-butyl ether, and the like.

Examples of cyclic ethers include tetrahydrofuran, dioxane, and the like.

Examples of higher hydrocarbons include decane, dodecane, undecane, and the like.

Examples of aromatic hydrocarbons include benzene, toluene, xylene, and the like.

Examples of ketones include acetone, methyl ethyl ketone, methyl isobutyl ketone, cyclohexanone, 4-hydroxy-4-methyl-2-pentanone, diacetone alcohol, and the like.

Examples of esters include ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, and the like.

Among these, monohydric alcohols, ethers, cyclic ethers, alkyl ethers of polyhydric alcohols, alkyl ether acetates of polyhydric alcohol, and higher hydrocarbons are preferable.

Optional Component

The liquid immersion lithography upper-layer film-forming composition may further include an optional component (e.g., surfactant) in order to improve the applicability, defoamability, and leveling properties, and the like of the composition as long as the desired effects are not impaired.

Examples of commercially available products of the surfactant include BM-1000, BM-1100 (manufactured by BM Chemie), Megafac F142D, Megafac F172, Megafac F173, Megafac F183 (manufactured by DIC Corporation), Fluorad FC-135, Fluorad FC-170C, Fluorad FC-430, Fluorad FC-431 (manufactured by Sumitomo 3M, Ltd.), Surflon S-112, Surflon S-113, Surflon S-131, Surflon S-141, Surflon S-145 (manufactured by Asahi Glass Co., Ltd.), SH-28PA, SH-190, SH-193, SZ-6032, SF-8428 (manufactured by Dow Corning Toray Silicone Co., Ltd.), Emulgen A-60, Emulgen 104 P, Emulgen 306P (manufactured by Kao Corporation), and the like. The surfactant is preferably used in an amount of 5 mass % or less based on 100 mass % of the polymer component. These surfactants may be used either individually or in combination.

Production of Liquid Immersion Lithography Upper-Layer Film-Forming Composition

The liquid immersion lithography upper-layer film-forming composition is produced as a solution or a dispersion by mixing the polymer (A), the polymer (B) (optional), the additional polymer (optional), and an optional component with the solvent (S). The liquid immersion lithography upper-layer film-forming composition may be produced by preparing a solution so that the desired total solid content is achieved, and filtering the solution through a filter having a pore size of about 200 nm. The solid content is not particularly limited, but is normally 0.1 to 20.0 mass %.

It is preferable that the liquid immersion lithography upper-layer film-forming composition have an impurity (e.g., halogen ions and metals) content as low as possible. The liquid immersion lithography upper-layer film-forming composition exhibits improved applicability and improved (uniform) solubility in an alkaline developer by reducing the impurity content. The polymer component may be purified by chemical purification (e.g., washing with water or liquid-liquid extraction), or a combination of chemical purification and physical purification (e.g., ultrafiltration or centrifugation), for example.

Photoresist Pattern-Forming Method

A photoresist pattern-forming method according to one embodiment of the invention includes (1) applying a photoresist composition to a substrate to form a photoresist film (hereinafter may be referred to as "step (1)"), (2) applying the liquid immersion lithography upper-layer film-forming composition to the photoresist film to form a liquid immersion lithography upper-layer film (hereinafter may be referred to as "step (2)"), (3) exposing the photoresist film and the liquid immersion lithography upper-layer film via an immersion medium and a mask having a given pattern, the immersion medium being disposed between the liquid immersion lithography upper-layer film and a lens (hereinafter may be referred to as "step (3)"), and (4) developing the photoresist film and the liquid immersion lithography upper-layer film that have been exposed (hereinafter may be referred to as "step (4)").

According to the above photoresist pattern-forming method, it is possible to form a liquid immersion lithography upper-layer film that exhibits sufficient transmittance at an exposure wavelength of 248 nm (KrF) or 193 nm (ArF), suppresses intermixing with the photoresist film, is rarely eluted into the immersion medium (e.g., water) during liquid immersion lithography (i.e., is stable), forms a high-resolution resist pattern, and has a sufficiently high receding contact angle. Specifically, it is possible to effectively suppress occurrence of watermark defects and pattern defects at a normal scan speed (e.g., 500 mm/s), and effectively suppress occurrence of defects even at a high scan speed (e.g., 700 mm/s).

Step (1)

The step (1) includes applying a photoresist composition to a substrate to form a photoresist film A silicon wafer, an aluminum-coated silicon wafer, or the like may normally be used as the substrate. An organic or inorganic antireflective film may be formed on the substrate in order to maximize the properties of the photoresist film (see Japanese Examined Patent Publication (KOKOKU) No. 6-12452, for example).

The photoresist composition may be appropriately depending on the application (objective) of the resist. A chemically-amplified positive-tone resist material that includes an acid generator is preferably used as the photoresist composition. Examples of the chemically-amplified positive-tone resist material include a radiation-sensitive polymer composition that includes an acid-dissociable group-modified alkali-soluble resin and a photoacid generator as essential components, and the like. The radiation-sensitive polymer composition is designed so that an acid is generated by the acid generator upon application of radiation (exposure), and the acid-dissociable group that protects an acidic group (e.g., carboxyl group) included in the polymer dissociates due to the acid so that the acidic group is exposed. As a result, the alkaline-solubility of the exposed area of the resist increases. Therefore, the exposed area is dissolved and removed by an alkaline developer to obtain a positive-tone resist pattern.

The polymer preferably includes a structural unit that includes an acid-dissociable group. The content of the structural unit that includes an acid-dissociable group in the polymer is preferably 30 to 60 mol % based on the total structural units included in the polymer.

Examples of the polymer include a polymer that includes a structural unit shown by any of the following formulas.

[Chemical Formula 9]

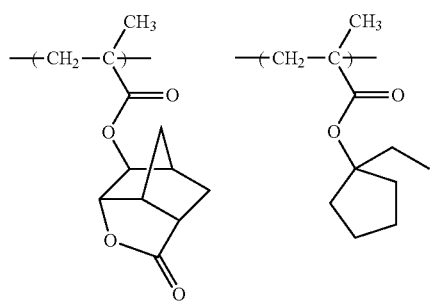

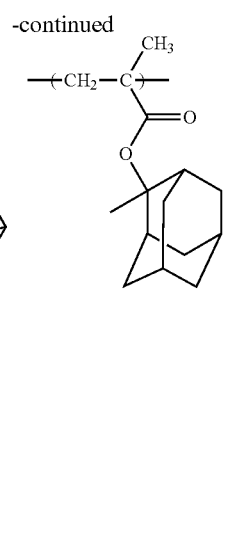

Examples of the acid generator include triphenylsulfonium nonafluoro-n-butane sulfonate, 4-cyclohexylphenyldiphenylsulfonium nonafluoro-n-butanesulfonate, 1-(4-n-butoxynaphthalen-1-yl)tetrahydrothiophenium nonafluoro-n-butanesulfonate, triphenylsulfonium 2-(bicyclo[2.2.1]hept-2'-yl)-1,1,2,2-tetrafluoroethane sulfonate, 1-(4-n-butoxynaphthyl)tetrahydrothiophenium 2-(bicyclo[2.2.1]hept-2'-yl)-1,1,2,2-tetrafluoroethanesulfonate, triphenylsulfonium 2-(bicyclo[2.2.1]hept-2'-yl)-1,1-difluoroethane sulfonate, and the like.

The photoresist film may be formed by adding a solvent to a polymer component so that the total solid content is 0.2 to 20 mass %, filtering the solution through a filter having a pore size of about 30 nm to prepare a coating liquid, and applying the coating liquid to a substrate by a known coating method (e.g., spin coating, cast coating, or roll coating). The photoresist film (coating liquid) may be prebaked in order to volatilize the solvent.

Step (2)

The step (2) includes applying the liquid immersion lithography upper-layer film-forming composition to the photoresist film to form a liquid immersion lithography upper-layer film. A situation in which the immersion medium comes in direct contact with the photoresist film during liquid immersion lithography can be prevented by forming the liquid immersion lithography upper-layer film. This makes it possible to effectively prevent a situation in which the lithographic performance of the photoresist film deteriorates due to permeation of the immersion medium, or the lens of the projection aligner is contaminated due to components eluted from the photoresist film.

It is preferable that the thickness of the liquid immersion lithography upper-layer film be close to an odd multiple of $\lambda/4$ m (where, $\lambda$ is the wavelength of radiation, and m is the refractive index of the protective film) as much as possible. This makes it possible to increase the antireflective effect at the interface with the photoresist film.

Step (3)

The step (3) includes exposing the photoresist film and the liquid immersion lithography upper-layer film via an immersion medium and a mask having a given pattern, the immersion medium being disposed between the liquid immersion lithography upper-layer film and a lens.

A liquid having a refractive index higher than that of air is normally used as the immersion medium. It is preferable to use water (more preferably purified water) as the immersion medium. The pH of the immersion medium may optionally be adjusted. The photoresist film is exposed by applying radiation to the photoresist film via the mask having a given pattern in a state in which the immersion medium is interposed between the liquid immersion lithography upper-layer film and the lens (i.e., the space between the lens of the exposure system and the photoresist film is filled with the immersion medium).

Radiation used for liquid immersion lithography may be appropriately selected depending on the types of the photoresist film and the liquid immersion lithography upper-layer film. For example, visible light, ultraviolet rays (e.g., g-line or i-line), deep ultraviolet rays (e.g., excimer laser light), X-rays (e.g., synchrotron radiation), charged particle rays (e.g., electron beams), or the like may be used. Among these, ArF excimer laser light (wavelength: 193 nm) and KrF excimer laser light (wavelength: 248 nm) are preferable. The exposure conditions (e.g., dose) may be appropriately set depending on the composition of the photoresist composition, the type of additive, and the like.

It is preferable to perform post-exposure bake (PEB) in order to improve the resolution, the pattern shape, the developability, and the like of the photoresist film. The PEB temperature is appropriately selected depending on the type of the photoresist composition, but is normally 30 to 200° C., and preferably 50 to 150° C.

Step (4)

The step (4) includes developing the photoresist film and the liquid immersion lithography upper-layer film that have been exposed. It is preferable to use an alkaline aqueous solution as the developer used for development. Examples of the alkali include sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5.4.0]-7-undecene, 1,5-diazabicyclo-[4.3.0]-5-nonane, and the like. It is preferable to use a tetraalkylammonium hydroxide aqueous solution as the developer.

An appropriate amount of a water-soluble organic solvent (e.g., methanol or ethanol) or a surfactant may be added to the developer. When developing the photoresist film using an alkaline aqueous solution, the photoresist film is normally washed with water after development. The photoresist film is then appropriately dried to form the desired photoresist pattern.

EXAMPLES

The invention is further described below by way of examples. Note that the invention is not limited to the following examples.

Synthesis of Polymer

The following monomers were used to produce the polymers.

M-1: (1,1,1-trifluoro-2-trifluoromethyl-2-hydroxy-4-butyl)methacrylate
M-2: vinylsulfonic acid
M-3: (2,2,2-trifluoroethyl)methacrylate
M-4: (1-trifluoromethyl-2,2,2-trifluoroethyl)methacrylate
M-5: dicyclopentyl methacrylate
M-6: (1,1,1-trifluoro-2-trifluoromethyl-2-hydroxy-3-propyl)methacrylate
M-7: (1,1,1-trifluoro-2-trifluoromethyl-2-hydroxy-4-pentyl)methacrylate
M-8: 2-methacryloyloxyethyl hexahydrophthalate

[Chemical Formula 10]

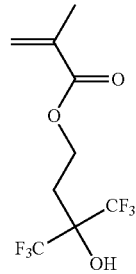
(M-1)

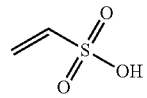
(M-2)

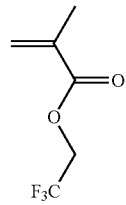
(M-3)

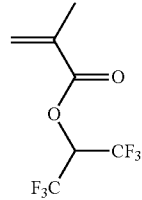
(M-4)

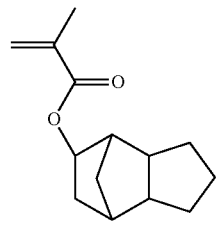
(M-5)

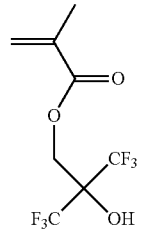
(M-6)

-continued (M-7)

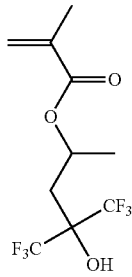

(M-8)

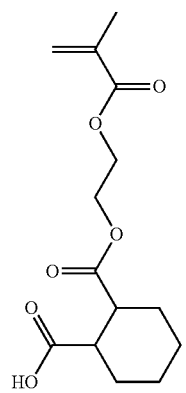

Synthesis of Polymer

Synthesis Example 1

46.81 g (85 mol %) of the monomer (M-1) that produces the structural unit (I) and 4.53 g of 2,2'-azobis(methyl 2-methylpropionate) (initiator) were dissolved in 40.00 g of isopropanol to prepare a monomer solution. A three-necked flask (200 ml) equipped with a thermometer and a dropping funnel was charged with 50 g of isopropanol, and purged with nitrogen for 30 minutes. The inside of the flask was then heated to 80° C. with stirring using a magnetic stirrer. The monomer solution was added dropwise to the flask using the dropping funnel over 2 hours. After the dropwise addition, the mixture was reacted for 1 hour. 10 g of an isopropanol solution containing 3.19 g (15 mol %) of the monomer (M-2) that produces the structural unit (II) was added to the mixture over 30 minutes. After reacting the mixture for 1 hour, the mixture was cooled to 30° C. or less to obtain a copolymer solution. The copolymer solution was concentrated to 150 g, and put in a separating funnel. 50 g of methanol and 600 g of n-hexane were added to the separating funnel to effect separation and purification. The lower-layer solution thus separated was collected. The lower-layer solution was diluted with isopropanol so that the amount of the diluted solution was 100 g, and put in the separating funnel. 50 g of methanol and 600 g of n-hexane were added to the separating funnel to effect separation and purification, and the lower-layer solution was collected. The solvent of the lower-layer solution was replaced with 4-methyl-2-pentanol so that the total amount of the mixture was 250 g. 250 g of water was then added to the mixture to effect separation and purification, and the upper-layer solution was collected. The solvent of the upper-layer solution thus collected was replaced with 4-methyl-2-pentanol to obtain a resin solution. The solid content of the resin solution was calculated from the mass of residues obtained by placing 0.3 g of the resin solution on an aluminum dish, and heating the resin solution on a hot plate at 140° C. for 1 hour, and used when producing the liquid immersion lithography upper-layer film-forming composition solution, and calculating the yield. A copolymer (P-1) contained in the resin solution had an Mw of 10,010 and an Mw/Mn ratio of 1.55. The yield was 75%. The ratio of the content of the structural unit (I) to the content of the structural unit (II) was 98:2 (mol %).

Synthesis Examples 2 to 7, 14, 15, and 25

A polymer was synthesized in the same manner as in Synthesis Example 1, except for changing the monomers as shown in Table 1. The symbol "-" in Table 1 indicates that the corresponding monomer was not used. The values in Table 1 indicate the content (%) of the structural unit produced by each monomer.

Synthesis of Additional Polymer

Synthesis Example 16

37.3 g of the monomer (M-7) that produces the structural unit (V) was dissolved in 4.5 g of methyl ethyl ketone to prepare a monomer solution. A three-necked flask (500 ml) equipped with a thermometer and a dropping funnel was charged with 69.6 g of the monomer (M-4) that produces the structural unit (III), 4.5 g of 2,2-azobis(methyl 2-methylisopropionate), and 95.5 g of methyl ethyl ketone, and purged with nitrogen for 30 minutes. The inside of the flask was then heated to 75° C. with stirring using a magnetic stirrer. The monomer solution was added dropwise to the flask using the dropping funnel over 5 minutes, and aged for 6 hours. The mixture was cooled to 30° C. or less to obtain a copolymer solution. The copolymer solution was concentrated to 150 g, and put in a separating funnel. 150 g of methanol and 750 g of n-hexane were added to the separating funnel to effect separation and purification, and the lower-layer solution was collected. The solvent of the lower-layer solution was then replaced with 4-methyl-2-pentanol. The resulting copolymer (P-16) had an Mw of 7500 and an Mw/Mn ratio of 1.50. The yield was 50%. The ratio of the content of the structural unit (V) to the content of the structural unit (III) was 60:40 (mol %).

Synthesis Examples 8 to 13 and 17 to 21

An additional polymer was synthesized in the same manner as in Synthesis Example 16, except for changing the monomers as shown in Table 1. The symbol "-" in Table 1 indicates that the corresponding monomer was not used. The values in Table 1 indicate the content (%) of the structural unit produced by each monomer.

Synthesis Example 22

46.95 g (85 mol %) of the monomer (M-8) that produces the structural unit (VI) and 6.91 g of 2,2'-azobis(methyl 2-methylpropionate) (initiator) were dissolved in 100 g of isopropanol to prepare a monomer solution. A three-necked flask (500 ml) equipped with a thermometer and a dropping funnel was charged with 50 g of isopropanol, and purged with nitrogen for 30 minutes. The inside of the flask was then heated to 80° C. with stirring using a magnetic stirrer. The monomer solution was added dropwise to the flask using the dropping funnel over 2 hours. After the dropwise addition, the mixture was reacted for 1 hour. 10 g of an isopropanol solution containing 3.05 g (15 mol %) of the monomer (M-2) that produces the structural unit (II) was added to the mixture over 30 minutes. After reacting the mixture for 1 hour, the mixture was cooled to 30° C. or less to obtain a copolymer solution. The copolymer solution was concentrated to 150 g, and put in a separating funnel. 50 g of methanol and 600 g of n-hexane were added to the separating funnel to effect separation and purification. The lower-layer solution thus separated was collected. The lower-layer solution was diluted with isopropanol so that the amount of the diluted solution was 100 g, and put in the separating funnel. 50 g of methanol and 600 g of n-hexane were added to the separating funnel to effect separation and purification, and the lower-layer solution was collected. The solvent of the lower-layer solution was replaced with 4-methyl-2-pentanol so that the total amount of the mixture was 250 g. 250 g of water was then added to the mixture to effect separation and purification, and the upper-layer solution was collected. The solvent of the upper-layer solution thus collected was replaced with 4-methyl-2-pentanol to obtain a resin solution. A copolymer (P-22) contained in the resin solution had an Mw of 11,060 and an Mw/Mn ratio of 1.55. The yield was 75%. The ratio of the content of the structural unit (VI) to the content of the structural unit (II) was 96:4 (mol %).

[Chemical Formula 11]

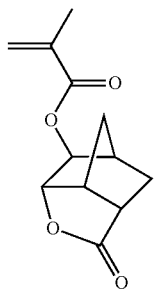

(M-9)

TABLE 1

| | | Content (mol %) of structural unit | | | | | | | |
|---|---|---|---|---|---|---|---|---|---|
| | | M-1 Structural unit (I) | M-2 Structural unit (I) | M-3 Structural unit (III) | M-4 Structural unit (III) | M-5 Structural unit (IV) | M-6 Structural unit (V) | M-7 Structural unit (V) | M-8 Structural unit (VI) |
| Synthesis Example 1 | P-1 | 98 | 2 | — | — | — | — | — | — |
| Synthesis Example 2 | P-2 | 99 | 1 | — | — | — | — | — | — |
| Synthesis Example 3 | P-3 | 80 | 20 | — | — | — | — | — | — |
| Synthesis Example 4 | P-4 | 94 | 1 | 5 | — | — | — | — | — |
| Synthesis Example 5 | P-5 | 25 | 20 | 55 | — | — | — | — | — |
| Synthesis Example 6 | P-6 | 94 | 1 | — | — | 5 | — | — | — |
| Synthesis Example 7 | P-7 | 25 | 20 | — | — | 55 | — | — | — |
| Synthesis Example 8 | P-8 | 60 | — | — | 40 | — | — | — | — |
| Synthesis Example 9 | P-9 | 20 | — | — | 80 | — | — | — | — |
| Synthesis Example 10 | P-10 | 80 | — | — | 20 | — | — | — | — |
| Synthesis Example 11 | P-11 | 30 | — | — | 70 | — | — | — | — |
| Synthesis Example 12 | P-12 | 80 | — | — | 15 | 5 | — | — | — |
| Synthesis Example 13 | P-13 | 20 | — | — | 50 | 30 | — | — | — |
| Synthesis Example 14 | P-14 | — | 2 | — | — | — | 98 | — | — |
| Synthesis Example 15 | P-15 | — | 5 | — | — | — | 95 | — | — |
| Synthesis Example 16 | P-16 | — | — | — | 40 | — | — | 60 | — |
| Synthesis Example 17 | P-17 | — | — | — | 80 | — | — | 20 | — |
| Synthesis Example 18 | P-18 | — | — | — | 20 | — | — | 80 | — |
| Synthesis Example 19 | P-19 | — | — | — | 70 | — | — | 30 | — |
| Synthesis Example 20 | P-20 | — | — | — | 15 | 5 | — | 80 | — |
| Synthesis Example 21 | P-21 | — | — | — | 50 | 30 | — | 20 | — |
| Synthesis Example 22 | P-22 | — | 4 | — | — | — | — | — | 96 |
| Synthesis Example 23 | P-23 | — | 2 | — | — | — | — | 98 | — |

Production of Liquid Immersion Lithography Upper-Layer Film-Forming Composition Example 1

92 parts by mass of the polymer (P-1) (polymer (A)), 3 parts by mass of the polymer (P-8) (polymer (B)), 5 parts by mass of the polymer (P-22) (additional polymer), 5634 parts by mass of 4-methyl-2-pentanol (solvent (S)), and 1409 parts by mass of diisoamyl ether were mixed. The mixture was stirred for 2 hours, and filtered through a filter having a pore size of 200 nm to obtain a liquid immersion lithography upper-layer film-forming composition (solid content: 1.4 mass %).

Examples 2 to 108 and Comparative Examples 1 to 14

A liquid immersion lithography upper-layer film-forming composition was produced in the same manner as in Example 1, except for changing the polymers (type and amount) as shown in Tables 2 to 4. Note that the symbol "-" in Tables 2 to 4 indicates that the corresponding component was not used.

Synthesis of Photoresist Composition Polymer

The monomers shown by the following formulas were used to produce the photoresist composition polymers.

-continued

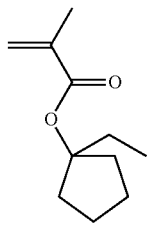

(M-10)

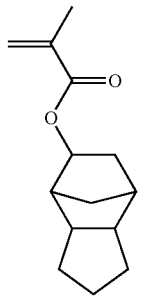

(M-11)

(M-12)

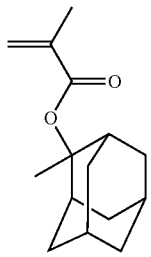

Synthesis Example 23

A monomer solution was prepared by dissolving 53.93 g (50 mol %) of the compound (M-9), 35.38 g (40 mol %) of the compound (M-10), and 10.69 g (10 mol %) of the compound (M-11) in 200 g of 2-butanone, and adding 5.58 g of dimethyl 2,2'-azobis(2-methylpropionate) to the solution. Separately, a three-necked flask (500 ml) was charged with 100 g of 2-butanone, and purged with nitrogen for 30 minutes. The flask was then heated to 80° C. with stirring, and the monomer solution was added dropwise to the flask using a dripping funnel over 3 hours. The monomers were polymerized for 6 hours from the start of dropwise addition of the monomer solution. After completion of polymerization, the polymer solution was cooled with water to 30° C. or less, and poured into 2000 g of methanol. A precipitated white powder was collected by filtration. The collected white powder was washed twice with 400 g of methanol in a slurry state, collected by filtration, and dried at 50° C. for 17 hours to obtain a white powdery polymer (D-1) (74 g, yield: 74%). The polymer (D-1) had an Mw of 6900 and an Mw/Mn ratio of 1.70. The ratio of structural units derived from the compounds (M-9), (M-10), and (M-11) contained in the polymer (D-1) as determined by $^{13}$C-NMR analysis was 53.0:37.2:9.8 (mol %). The content of low-molecular-weight components derived from the monomers in the polymer (D-1) was 0.03 mass %.

Synthesis Example 24

A monomer solution was prepared by dissolving 47.54 g (46 mol %) of the compound (M-9), 12.53 g (15 mol %) of the compound (M-10), and 39.93 g (39 mol %) of the compound (M-12) in 200 g of 2-butanone, and adding 4.08 g of 2,2'-azobis(isobutylonitrile) to the solution. Separately, a three-necked flask (1000 ml) was charged with 100 g of 2-butanone, and purged with nitrogen for 30 minutes. The flask was then heated to 80° C. with stirring, and the monomer solution was added dropwise to the flask using a dropping funnel over 3 hours. The monomers were polymerized for 6 hours from the start of dropwise addition of the monomer solution. After completion of polymerization, the polymer solution was cooled with water to 30° C. or less, and poured into 2000 g of methanol. A precipitated white powder was collected by filtration. The collected white powder was washed twice with 400 g of methanol in a slurry state, collected by filtration, and dried at 50° C. for 17 hours to obtain a white powdery polymer (D-2) (73 g, yield: 73%). The polymer (D-2) had an Mw of 5700 and an Mw/Mn ratio of 1.7. The ratio of structural units derived from the compounds (M-9), (M-10), and (M-12) contained in the polymer (D-2) as determined by $^{13}$C-NMR analysis was 51.4:14.6:34.0 (mol %).

Production of Photoresist Composition

Synthesis Example 25

30 parts by mass of the polymer (D-1), 70 parts by mass of the polymer (D-2), 4 parts by mass of triphenylsulfonium nonafluoro-n-butanesulfonate (acid generator), 5 parts by mass of 1-(4-n-butoxynaphthalen-1-yl)tetrahydrothiophenium nonafluoro-n-butanesulfonate (acid generator), 0.83 parts by mass of R-(+)-(tert-butoxycarbonyl)-2-piperidinemethanol (acid diffusion controller), 1710 parts by mass of propylene glycol monomethyl ether acetate (solvent), and 730 parts by mass of cyclohexanone (solvent) were mixed to obtain a photoresist composition.

EVALUATION

The following items were evaluated using each liquid immersion lithography upper-layer film-forming composition and the photoresist composition.

Removability of Liquid Immersion Lithography Upper-Layer Film

The liquid immersion lithography upper-layer film-forming composition was spin-coated onto an 8-inch silicon wafer using a coater/developer ("CLEAN TRACK ACT 8" manufactured by Tokyo Electron Ltd.), and baked at 90° C. for 60 seconds to form a liquid immersion lithography upper-layer film having a thickness of 90 nm. The thickness was measured by using a spectroscopic film thickness measurement system ("Lambda Ace VM90" manufactured by Dainippon Screen Mfg. Co., Ltd.). The film was subjected to paddle development (developer: 2.38% TMAH aqueous solution) for 60 seconds using the coater/developer ("CLEAN TRACK ACT 8"), and the wafer was spin-dried. The surface of the wafer was then observed. The liquid immersion lithography upper-layer films formed using the liquid immersion lithography upper-layer film-forming compositions of Examples 1 to 108 were developed so that residues did not remain on the surface of the wafer (i.e., exhibited excellent removability).

Receding Contact Angle (°)

The liquid immersion lithography upper-layer film-forming composition was spin-coated onto an 8-inch silicon wafer, and prebaked on a hot plate at 90° C. for 60 seconds to form a liquid immersion lithography upper-layer film having a thickness of 30 nm. The receding contact angle (°) was immediately measured at a temperature of 23° C. (room temperature) and a humidity of 45% under atmospheric pressure using a contact angle meter ("DSA-10" manufactured by KRUS). Specifically, the position of the wafer stage of the contact angle meter ("DSA-10") was adjusted, and the wafer was placed on the stage. After injecting water into the needle, the position of the needle was adjusted to the initial position at which a waterdrop can be formed on the wafer. Water was discharged from the needle to form a waterdrop (25 μl) on the wafer. After removing the needle, the needle was again moved downward to the initial position, and introduced into the waterdrop. The waterdrop was sucked via the needle for 90 seconds at a rate of 10 μl/min, and the contact angle was measured every second (90 times in total). The average value of twenty contact angle measured values (20 seconds) after the measured value became stable was calculated, and taken as the receding contact angle (°). The liquid immersion lithography upper-layer films formed using the liquid immersion lithography upper-layer film-forming compositions of Examples 1 to 108 had a receding contact angle of 65.0° or more.

Advancing Contact Angle (°)

The photoresist composition was spin-coated onto an 8-inch silicon wafer, and prebaked on a hot plate at 90° C. for 60 seconds to form a photoresist film having a thickness of 120 nm. The advancing contact angle (°) was immediately measured at a temperature of 23° C. (room temperature) and a humidity of 45% under atmospheric pressure using the contact angle meter ("DSA-10"). Specifically, the position of the wafer stage of the contact angle meter ("DSA-10") was adjusted, and the wafer was placed on the stage. After injecting water into the needle, the position of the needle was adjusted to the initial position at which a waterdrop can be formed on the wafer. Water was discharged from the needle to form a waterdrop (15 µl) on the wafer. After removing the needle, the needle was again moved downward to the initial position, and introduced into the waterdrop. The waterdrop was discharged via the needle for 90 seconds at a rate of 10 µl/min, and the contact angle was measured every second (90 times in total). The average value of twenty contact angle measured values (20 seconds) after the measured value became stable was calculated, and taken as the advancing contact angle (°). The liquid immersion lithography upper-layer films formed using the liquid immersion lithography upper-layer film-forming compositions of Examples 1 to 108 had an advancing contact angle of 95.0° or less.

Intermixing

The photoresist composition was spin-coated onto an 8-inch silicon wafer that was subjected to a hexamethyldisilazane (HMDS) treatment (100° C., 60 seconds) in advance using the coater/developer ("CLEAN TRACK ACT 8"). The photoresist composition was prebaked on a hot plate at 90° C. for 60 seconds to form a photoresist film having a thickness of 120 nm. The liquid immersion lithography upper-layer film-forming composition was spin-coated onto the photoresist film, and prebaked at 90° C. for 60 seconds to form a liquid immersion lithography upper-layer film having a thickness of 30 nm. Ultrapure water was discharged (60 seconds) to the wafer through the rinse nozzle of the coater/developer ("CLEAN TRACK ACT 8"), and the wafer was spin-dried at 4000 rpm for 15 seconds. The wafer was then subjected to puddle development (developer: 2.38% TMAH aqueous solution) using the LD nozzle of the coater/developer ("CLEAN TRACK ACT 8") to remove the liquid immersion lithography upper-layer film Note that the photoresist film that was not exposed remained on the wafer after puddle development. The thickness of the photoresist film was measured before and after development using a spectroscopic film thickness measurement system ("LambdaAce VM90" manufactured by Dainippon Screen Mfg. Co., Ltd.). When a change in thickness was within 5%, it was determined that intermixing did not occur between the photoresist film and the upper-layer film. The liquid immersion lithography upper-layer films formed using the liquid immersion lithography upper-layer film-forming compositions of Examples 1 to 108 did not undergo intermixing.

Elution Volume (mol/cm$^2$)

Figure 2:
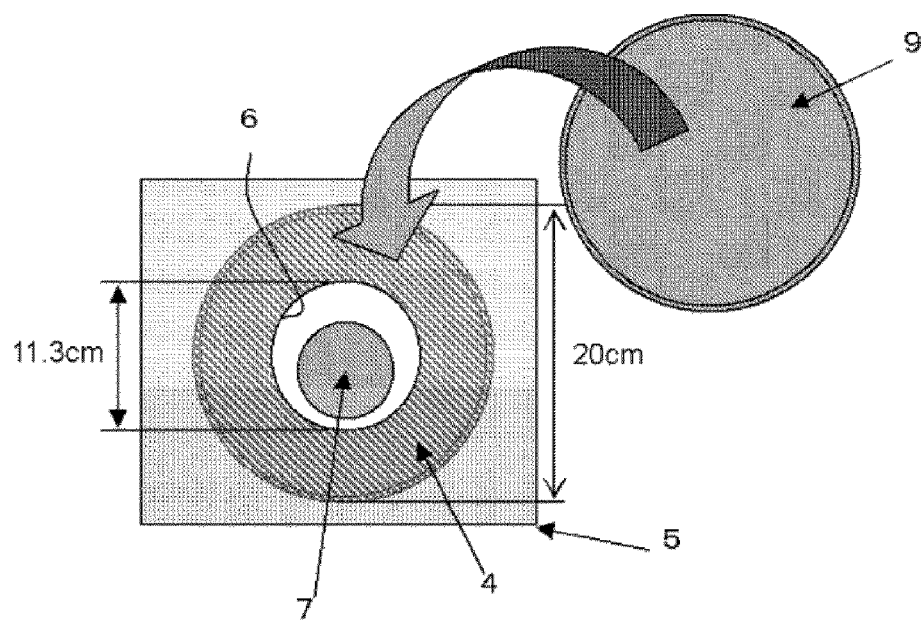
FIG. 2 is a schematic view showing a state in which an 8-inch silicon wafer is placed on a silicone rubber sheet so that leakage of ultrapure water does not occur when measuring the elution volume from an upper-layer film formed using a liquid immersion lithography upper-layer film-forming composition.
Figure 3:
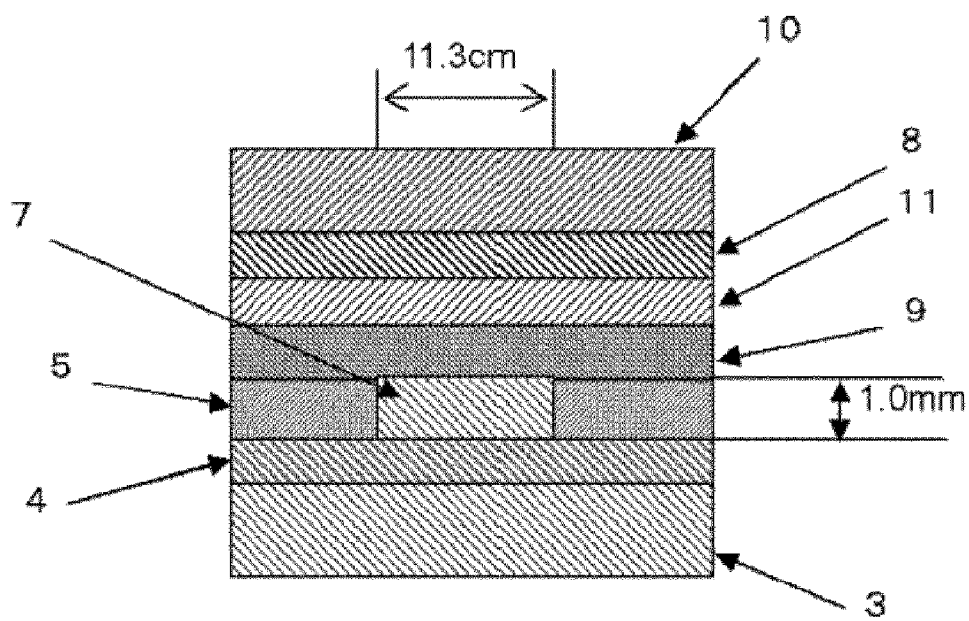
FIG. 3 is a cross-sectional view showing a state when measuring the elution volume from an upper-layer film formed using a liquid immersion lithography upper-layer film-forming composition.

As shown in FIGS. 2 and 3, an 8-inch silicon wafer 3 was subjected to an HMDS treatment (100° C., 60 seconds) using the coater/developer ("CLEAN TRACK ACT 8") to form an HMDS-treated layer 4. A square (30×30 cm) silicone rubber sheet 5 (manufactured by Kureha Elastomer Co., Ltd., thickness: 1.0 mm) having a circular center opening (diameter: 11.3 cm) was placed on the side of the wafer 3 on which the HMDS-treated layer 4 was formed. The silicone rubber sheet 5 was placed so that the center opening (opening 6) was positioned at the center of the wafer 3. The opening 6 of the silicone rubber sheet 5 was filled with 10 ml of ultrapure water 7 using a 10 ml whole pipette. An 8-inch silicon wafer 10 on which a lower-layer antireflective film 8, a photoresist film 11, and a liquid immersion lithography upper-layer film 9 were formed was provided. The wafer 10 was placed on the wafer 3 so that the liquid immersion lithography upper-layer film 9 was positioned on the silicone rubber sheet 5 (i.e., the liquid immersion lithography upper-layer film 9 came in contact with the ultrapure water 7 so that leakage of the ultrapure water 7 did not occur). The lower-layer antireflective film 8, the photoresist film 11, and the liquid immersion lithography upper-layer film 9 were formed on the wafer 10 as follows. Specifically, a lower-layer antireflective film-forming composition ("ARC29A" manufactured by Brewer Science) was applied to the wafer 10 using the coater/developer ("CLEAN TRACK ACT 8") to form the lower-layer antireflective film 8 having a thickness of 77 nm. The photoresist composition was spin-coated onto the lower-layer antireflective film 8 using the coater/developer ("CLEAN TRACK ACT 8"), and baked at 115° C. for 60 seconds to form the photoresist film 11 having a thickness of 205 nm. The liquid immersion lithography upper-layer film-forming composition was applied to the photoresist film 11 to form the liquid immersion lithography upper-layer film 9. The wafer 10 was placed on the wafer 3 so that the liquid immersion lithography upper-layer film 9 was positioned on the silicone rubber sheet 5, and allowed to stand for 10 seconds. After removing the wafer 10, the ultrapure water 7 that came in contact with the liquid immersion lithography upper-layer film 9 was collected using a glass syringe. The collected ultrapure water 7 was used as an analysis sample. The recovery rate of the ultrapure water 7 with which the opening 6 of the silicone rubber sheet 5 was filled was 95% or more. The peak intensity of the anion site of the acid generator included in the analysis sample (ultrapure water) was measured under the following measurement conditions using a liquid chromatograph mass spectrometer (LC-MS) (LC section: "SERIES 1100" manufactured by AGILENT Corp., MS section: "Mariner" manufactured by PerSeptive Biosystems, Inc.). The peak intensity of an aqueous solution (1 ppb, 10 ppb, or 100 ppb) of the acid generator used to produce the photoresist composition was measured under the following measurement conditions, and a calibration curve was drawn. The elution volume of the acid generator (anion site) eluted into water was calculated using the calibration curve. Likewise, the peak intensity of an aqueous solution (1 ppb, 10 ppb, or 100 ppb) of the acid diffusion controller was measured under the following measurement conditions, and a calibration curve was drawn. The elution volume of the acid diffusion controller eluted into water was calculated using the calibration curve. The elution volume was evaluated as "Acceptable" when the sum of the elution volume of the anion site of the acid generator and the elution volume of the acid diffusion controller was $5.0 \times 10^{-12}$ mol/cm$^2$ or less. The liquid immersion lithography upper-layer films formed using the liquid immersion lithography upper-layer film-forming compositions of Examples 1 to 108 showed an acceptable elution volume. The following measurement conditions were used.

Column: CAPCELL PAK MG (manufactured by Shiseido Co., Ltd.)
Flow rate: 0.2 ml/min
Eluant: water/methanol (3:7) mixture containing 0.1 wt % of formic acid
Measurement temperature: 35° C.

Blob Defects

An 8-inch silicon wafer was subjected to an HMDS treatment (100° C., 60 seconds) using the coater/developer ("CLEAN TRACK ACT 8"). The photoresist composition was spin-coated onto the 8-inch silicon wafer, and prebaked on a hot plate at 90° C. for 60 seconds to form a photoresist film having a thickness of 120 nm. The liquid immersion lithography upper-layer film-forming composition was spin-coated onto the photoresist film, and prebaked at 90° C. for 60 seconds to form a liquid immersion lithography upper-layer film having a thickness of 30 nm. The liquid immersion lithography upper-layer film was then exposed via frosted glass on which a pattern was not formed. Next, ultrapure water was discharged (60 seconds) to the liquid immersion lithography upper-layer film through the rinse nozzle of the coater/developer ("CLEAN TRACK ACT 8"), and the wafer was spin-dried at 4000 rpm for 15 seconds. The wafer was then subjected to puddle development for 60 seconds using the LD nozzle of the coater/developer ("CLEAN TRACK ACT 8") to remove the liquid immersion lithography upper-layer film. A 2.38% TMAH aqueous solution was used as the developer. The degree by which the liquid immersion lithography upper-layer film remained undissolved was measured using a system "KLA2351" (manufactured by KLA-Tencor) to evaluate blob defects. A case where the number of detected development defects was 200 or less was evaluated as "Acceptable". The number of development defects detected when using the liquid immersion lithography upper-layer films formed using the liquid immersion lithography upper-layer film-forming compositions of Examples 1 to 108 was 200 or less.

Patterning Capability

A lower-layer antireflective film-forming composition ("ARC29A" manufactured by Brewer Science) was applied to an 8-inch silicon wafer using the coater/developer ("CLEAN TRACK ACT 8"), and prebaked at 205° C. for 60 seconds to form a lower-layer antireflective film having a thickness of 77 nm. The photoresist composition was spin-coated onto the lower-layer antireflective film, and prebaked at 90° C. for 60 seconds to form a photoresist film having a thickness of 120 nm. The liquid immersion lithography upper-layer film-forming composition was spin-coated onto the photoresist film, and prebaked at 90° C. for 60 seconds to form a liquid immersion lithography upper-layer film having a thickness of 30 nm. The liquid immersion lithography upper-layer film was exposed using an ArF projection aligner ("S306C" manufactured by Nikon Corporation) (NA: 0.78, σ: 0.85, ⅔ Ann). Next, ultrapure water was discharged (60 seconds) to the wafer through the rinse nozzle of the coater/developer ("CLEAN TRACK ACT 8"), and the wafer was spin-dried at 4000 rpm for 15 seconds. The wafer was then subjected to post-exposure bake (115° C., 60 seconds) using the hot plate of the coater/developer ("CLEAN TRACK ACT 8"), and subjected to puddle development (30 seconds) (developer: 2.38% TMAH aqueous solution) using the LD nozzle of the coater/developer ("CLEAN TRACK ACT 8"). The wafer was rinsed with ultrapure water, and spin-dried at 4000 rpm for 15 seconds. A dose at which a 1:1 line-and-space (1L1S) pattern having a line width of 90 nm was formed was taken as an optimum dose. A scanning electron microscope ("S-9380" manufactured by Hitachi High-Tech Fielding Corporation) was used for the measurement. The cross-sectional shape of the line-and-space pattern (line width: 90 nm) was observed using a scanning electron microscope ("S-4200" manufactured by Hitachi High-Tech Fielding Corporation). As shown in FIG. 1, a line width Lb in an intermediate area of a photoresist pattern 2 formed on a substrate 1 and a line width La at the top of the photoresist pattern were measured. The patterning capability was evaluated as "Acceptable" when $0.9 \leq La/Lb \leq 1.1$. The liquid immersion lithography upper-layer films formed using the liquid immersion lithography upper-layer film-forming compositions of Examples 1 to 108 exhibited an acceptable patterning capability.

Watermark Defects and Bubble Defects

A 12-inch silicon wafer on which a lower-layer antireflective film (thickness: 77 nm) ("ARC29A" manufactured by Brewer Science) was formed was used as a substrate. The lower-layer antireflective film was formed using a coater/developer ("CLEAN TRACK ACT 12" manufactured by Tokyo Electron Ltd.). The photoresist composition was spin-coated onto the substrate using the coater/developer ("CLEAN TRACK ACT 12"), and prebaked at 90° C. for 60 seconds to form a photoresist film having a thickness of 120 nm. The liquid immersion lithography upper-layer film-forming composition was spin-coated onto the photoresist film, and prebaked at 90° C. for 60 seconds to form a liquid immersion lithography upper-layer film having a thickness of 30 nm. The liquid immersion lithography upper-layer film was exposed via a mask pattern using an ArF projection aligner ("S610C" manufactured by Nikon Corporation, NA 0.85, σ0/σ1=0.97/0.78, Azimuth). In this case, purified water (immersion medium) was provided between the upper side of the liquid immersion lithography upper-layer film and the lens of the ArF projection aligner (liquid immersion lithography system). The liquid immersion lithography upper-layer film was baked at 115° C. for 60 seconds, developed at 23° C. for 60 seconds using a 2.38 mass % tetramethylammonium hydroxide aqueous solution, washed with water, and dried to form a positive-tone photoresist pattern. Defects were detected using a system "KLA2810" (manufactured by KLA-Tencor), and the resulting line-and-space (1L1S) pattern (line width: 100 nm) was observed using a scanning electron microscope ("S-9380" manufactured by Hitachi High Technologies Corporation) to classify the defects into watermark defects (i.e., defects considered to be caused by liquid immersion lithography using ArF excimer laser light) and bubble defects. A case where the number of watermark defects detected was less than 30 was evaluated as "AA", a case where the number of watermark defects detected was 30 or more and less than 50 was evaluated as "A" (acceptable), a case where the number of watermark defects detected was 50 or more and less than 100 was evaluated as "B" (fair), and a case where the number of watermark defects detected was more than 100 was evaluated as "C" (unacceptable). The evaluation results are shown in Tables 2 to 4 (see the item "Watermark defects"). A case where the number of bubble defects detected was 50 or less was evaluated as "Acceptable". The number of bubble defects detected when using the liquid immersion lithography upper-layer films formed using the liquid immersion lithography upper-layer film-forming compositions of Examples 1 to 108 was 50 or less.

Bridge Defects

A positive-tone photoresist pattern was formed in the same manner as described above (see the section entitled "Watermark defects"). Bridge defects were detected using a system "KLA2810" (manufactured by KLA-Tencor), and the resulting line-and-space (1L1S) pattern (line width: 100 nm) was observed using a scanning electron microscope ("S-9380" manufactured by Hitachi High Technologies Corporation). A case where the number of bridge defects detected was less than 50 was evaluated as "A" (acceptable), a case where the number of bridge defects detected was 50 or more and less than 100 was evaluated as "B" (fair), and a case where the number of bridge defects detected was more than 100 was evaluated as "C" (unacceptable). The results are shown in Tables 2 to 4.

TABLE 2

| | Polymer | | | | | | Watermark defects | Bridge defects |
|---|---|---|---|---|---|---|---|---|
| | Type | Amount (parts by mass) | Type | Amount (parts by mass) | Type | Amount (parts by mass) | | |
| Example 1 | P-1 | 92 | P-8 | 3 | P-22 | 5 | AA | A |
| Example 2 | P-1 | 75 | P-8 | 20 | P-22 | 5 | AA | A |
| Example 3 | P-1 | 37 | P-8 | 3 | P-22 | 60 | AA | A |
| Example 4 | P-1 | 20 | P-8 | 20 | P-22 | 60 | AA | A |
| Example 5 | P-1 | 100 | — | — | — | — | A | A |
| Example 6 | P-1 | 97 | P-8 | 3 | — | — | AA | A |
| Example 7 | P-1 | 80 | P-8 | 20 | — | — | AA | A |
| Example 8 | P-1 | 92 | P-16 | 3 | P-22 | 5 | AA | A |
| Example 9 | P-1 | 65 | P-16 | 15 | P-22 | 20 | AA | A |
| Example 10 | P-1 | 75 | P-16 | 20 | P-22 | 5 | AA | A |
| Example 11 | P-1 | 37 | P-16 | 3 | P-22 | 60 | AA | A |
| Example 12 | P-1 | 20 | P-16 | 20 | P-22 | 60 | AA | A |
| Example 13 | P-1 | 100 | — | — | — | — | A | A |
| Example 14 | P-1 | 97 | P-16 | 3 | — | — | AA | A |
| Example 15 | P-1 | 85 | P-16 | 15 | — | — | AA | A |
| Example 16 | P-1 | 80 | P-16 | 20 | — | — | AA | A |
| Example 17 | P-2 | 92 | P-8 | 3 | P-22 | 5 | AA | A |
| Example 18 | P-2 | 75 | P-8 | 20 | P-22 | 5 | AA | A |
| Example 19 | P-2 | 37 | P-8 | 3 | P-22 | 60 | AA | A |
| Example 20 | P-2 | 20 | P-8 | 20 | P-22 | 60 | AA | A |
| Example 21 | P-2 | 100 | — | — | — | — | A | A |
| Example 22 | P-2 | 97 | P-8 | 3 | — | — | AA | A |
| Example 23 | P-2 | 80 | P-8 | 20 | — | — | AA | A |
| Example 24 | P-3 | 92 | P-8 | 3 | P-22 | 5 | AA | A |
| Example 25 | P-3 | 75 | P-8 | 20 | P-22 | 5 | AA | A |
| Example 26 | P-3 | 37 | P-8 | 3 | P-22 | 60 | AA | A |
| Example 27 | P-3 | 20 | P-8 | 20 | P-22 | 60 | AA | A |
| Example 28 | P-3 | 100 | — | — | — | — | A | A |
| Example 29 | P-3 | 97 | P-8 | 3 | — | — | AA | A |
| Example 30 | P-3 | 80 | P-8 | 20 | — | — | AA | A |
| Example 31 | P-4 | 92 | P-8 | 3 | P-22 | 5 | AA | A |
| Example 32 | P-4 | 75 | P-8 | 20 | P-22 | 5 | AA | A |
| Example 33 | P-4 | 37 | P-8 | 3 | P-22 | 60 | AA | A |
| Example 34 | P-4 | 20 | P-8 | 20 | P-22 | 60 | AA | A |
| Example 35 | P-4 | 100 | — | — | — | — | A | A |
| Example 36 | P-4 | 97 | P-8 | 3 | — | — | AA | A |
| Example 37 | P-4 | 80 | P-8 | 20 | — | — | AA | A |
| Example 38 | P-5 | 92 | P-8 | 3 | P-22 | 5 | AA | A |
| Example 39 | P-5 | 75 | P-8 | 20 | P-22 | 5 | AA | A |
| Example 40 | P-5 | 37 | P-8 | 3 | P-22 | 60 | AA | A |
| Example 41 | P-5 | 20 | P-8 | 20 | P-22 | 60 | AA | A |
| Example 42 | P-5 | 100 | — | — | — | — | A | A |
| Example 43 | P-5 | 97 | P-8 | 3 | — | — | AA | A |
| Example 44 | P-5 | 80 | P-8 | 20 | — | — | AA | A |
| Example 45 | P-6 | 92 | P-8 | 3 | P-22 | 5 | AA | A |
| Example 46 | P-6 | 75 | P-8 | 20 | P-22 | 5 | AA | A |
| Example 47 | P-6 | 37 | P-8 | 3 | P-22 | 60 | AA | A |
| Example 48 | P-6 | 20 | P-8 | 20 | P-22 | 60 | AA | A |
| Example 49 | P-6 | 100 | — | — | — | — | A | A |
| Example 50 | P-6 | 97 | P-8 | 3 | — | — | AA | A |

TABLE 3

| | Polymer | | | | | | Watermark defects | Bridge defects |
|---|---|---|---|---|---|---|---|---|
| | Type | Amount (parts by mass) | Type | Amount (parts by mass) | Type | Amount (parts by mass) | | |
| Example 51 | P-6 | 80 | P-8 | 20 | — | — | AA | A |
| Example 52 | P-7 | 92 | P-8 | 3 | P-22 | 5 | AA | A |
| Example 53 | P-7 | 75 | P-8 | 20 | P-22 | 5 | AA | A |
| Example 54 | P-7 | 37 | P-8 | 3 | P-22 | 60 | AA | A |
| Example 55 | P-7 | 20 | P-8 | 20 | P-22 | 60 | AA | A |
| Example 56 | P-7 | 100 | — | — | — | — | A | A |
| Example 57 | P-7 | 97 | P-8 | 3 | — | — | AA | A |
| Example 58 | P-7 | 80 | P-8 | 20 | — | — | AA | A |
| Example 59 | P-8 | 3 | P-14 | 92 | P-22 | 5 | A | A |
| Example 60 | P-8 | 20 | P-14 | 75 | P-22 | 5 | A | A |
| Example 61 | P-8 | 3 | P-14 | 37 | P-22 | 60 | A | A |
| Example 62 | P-8 | 20 | P-14 | 20 | P-22 | 60 | A | A |
| Example 63 | P-8 | 3 | P-14 | 97 | — | — | A | A |
| Example 64 | P-8 | 20 | P-14 | 80 | — | — | A | A |

TABLE 3-continued

| | Polymer | | | | | | Watermark defects | Bridge defects |
|---|---|---|---|---|---|---|---|---|
| | Type | Amount (parts by mass) | Type | Amount (parts by mass) | Type | Amount (parts by mass) | | |
| Example 65 | P-1 | 77 | P-8 | 3 | P-22 | 20 | AA | A |
| Example 66 | P-1 | 60 | P-8 | 20 | P-22 | 20 | AA | A |
| Example 67 | P-1 | 77 | P-9 | 3 | P-22 | 20 | AA | A |
| Example 68 | P-1 | 60 | P-9 | 20 | P-22 | 20 | AA | A |
| Example 69 | P-1 | 97 | P-9 | 3 | — | — | AA | A |
| Example 70 | P-1 | 80 | P-9 | 20 | — | — | AA | A |
| Example 71 | P-1 | 77 | P-10 | 3 | P-22 | 20 | AA | A |
| Example 72 | P-1 | 60 | P-10 | 20 | P-22 | 20 | AA | A |
| Example 73 | P-1 | 97 | P-10 | 3 | — | — | AA | A |
| Example 74 | P-1 | 80 | P-10 | 20 | — | — | AA | A |
| Example 75 | P-1 | 77 | P-16 | 3 | P-22 | 20 | AA | A |
| Example 76 | P-1 | 60 | P-16 | 20 | P-22 | 20 | AA | A |
| Example 77 | P-1 | 97 | P-16 | 3 | — | — | AA | A |
| Example 78 | P-1 | 80 | P-16 | 20 | — | — | AA | A |
| Example 79 | P-1 | 77 | P-16 | 3 | P-22 | 20 | AA | A |
| Example 80 | P-1 | 60 | P-16 | 20 | P-22 | 20 | AA | A |
| Example 81 | P-1 | 97 | P-17 | 3 | — | — | AA | A |
| Example 82 | P-1 | 80 | P-17 | 20 | — | — | AA | A |
| Example 83 | P-1 | 77 | P-16 | 3 | P-22 | 20 | AA | A |
| Example 84 | P-1 | 60 | P-16 | 20 | P-22 | 20 | AA | A |
| Example 85 | P-1 | 97 | P-18 | 3 | — | — | AA | A |
| Example 86 | P-1 | 80 | P-18 | 20 | — | — | AA | A |
| Example 87 | P-1 | 77 | P-11 | 3 | P-22 | 20 | AA | A |
| Example 88 | P-1 | 65 | P-11 | 15 | P-22 | 20 | AA | A |
| Example 89 | P-1 | 60 | P-11 | 20 | P-22 | 20 | AA | A |
| Example 90 | P-1 | 77 | P-12 | 3 | P-22 | 20 | AA | A |

TABLE 4

| | Polymer | | | | | | Watermark defects | Bridge defects |
|---|---|---|---|---|---|---|---|---|
| | Type | Amount (parts by mass) | Type | Amount (parts by mass) | Type | Amount (parts by mass) | | |
| Example 91 | P-1 | 60 | P-12 | 20 | P-22 | 20 | AA | A |
| Example 92 | P-1 | 97 | P-12 | 3 | — | — | AA | A |
| Example 93 | P-1 | 80 | P-12 | 20 | — | — | AA | A |
| Example 94 | P-1 | 77 | P-13 | 3 | P-22 | 20 | AA | A |
| Example 95 | P-1 | 60 | P-13 | 20 | P-22 | 20 | AA | A |
| Example 96 | P-1 | 97 | P-13 | 3 | — | — | AA | A |
| Example 97 | P-1 | 80 | P-13 | 20 | — | — | AA | A |
| Example 98 | P-1 | 77 | P-16 | 3 | P-22 | 20 | AA | A |
| Example 99 | P-1 | 60 | P-16 | 20 | P-22 | 20 | AA | A |
| Example 100 | P-1 | 77 | P-19 | 3 | P-22 | 20 | AA | A |
| Example 101 | P-1 | 70 | P-19 | 10 | P-22 | 20 | AA | A |
| Example 102 | P-1 | 60 | P-19 | 20 | P-22 | 20 | AA | A |
| Example 103 | P-1 | 97 | P-20 | 3 | — | — | AA | A |
| Example 104 | P-1 | 80 | P-20 | 20 | — | — | AA | A |
| Example 105 | P-1 | 77 | P-16 | 3 | P-22 | 20 | AA | A |
| Example 106 | P-1 | 60 | P-16 | 20 | P-22 | 20 | AA | A |
| Example 107 | P-1 | 97 | P-21 | 3 | — | — | AA | A |
| Example 108 | P-1 | 80 | P-21 | 20 | — | — | AA | A |
| Comparative Example 1 | P-14 | 92 | P-16 | 3 | P-22 | 5 | A | B |
| Comparative Example 2 | P-14 | 75 | P-16 | 20 | P-22 | 5 | A | B |
| Comparative Example 3 | P-14 | 37 | P-16 | 3 | P-22 | 60 | A | B |
| Comparative Example 4 | P-14 | 20 | P-16 | 20 | P-22 | 60 | A | B |
| Comparative Example 5 | P-14 | 100 | — | — | — | — | A | B |
| Comparative Example 6 | P-14 | 97 | P-16 | 3 | — | — | A | B |
| Comparative Example 7 | P-14 | 80 | P-16 | 20 | — | — | A | B |
| Comparative Example 8 | P-15 | 92 | P-16 | 3 | P-22 | 5 | B | A |
| Comparative Example 9 | P-15 | 75 | P-16 | 20 | P-22 | 5 | B | A |
| Comparative Example 10 | P-15 | 37 | P-16 | 3 | P-22 | 60 | B | A |
| Comparative Example 11 | P-15 | 20 | P-16 | 20 | P-22 | 60 | B | A |
| Comparative Example 12 | P-15 | 100 | — | — | — | — | B | A |
| Comparative Example 13 | P-15 | 97 | P-16 | 3 | — | — | B | A |
| Comparative Example 14 | P-15 | 80 | P-16 | 20 | — | — | B | A |
| Comparative Example 15 | P-23 | 92 | P-16 | 3 | P-22 | 5 | A | B |
| Comparative Example 16 | P-23 | 75 | P-16 | 20 | P-22 | 5 | A | B |
| Comparative Example 17 | P-23 | 37 | P-16 | 3 | P-22 | 60 | A | B |
| Comparative Example 18 | P-23 | 20 | P-16 | 20 | P-22 | 60 | A | B |
| Comparative Example 19 | P-23 | 100 | — | — | — | — | A | B |

TABLE 4-continued

| | Polymer | | | | | | Watermark defects | Bridge defects |
|---|---|---|---|---|---|---|---|---|
| | Type | Amount (parts by mass) | Type | Amount (parts by mass) | Type | Amount (parts by mass) | | |
| Comparative Example 20 | P-23 | 97 | P-16 | 3 | — | — | A | B |
| Comparative Example 21 | P-23 | 80 | P-16 | 20 | — | — | A | B |

As is clear from the results shown in Tables 2 to 4, it was confirmed that the liquid immersion lithography upper-layer film-forming compositions of Examples 1 to 108 could form a liquid immersion lithography upper-layer film that can suppress occurrence of watermark defects and bridge defects. On the other hand, the liquid immersion lithography upper-layer film-forming compositions of Comparative Examples 1 to 7 using the polymer that did not include the structural unit (I) could not sufficiently suppress occurrence of bridge defects. The liquid immersion lithography upper-layer film-forming compositions of Comparative Examples 8 to 14 could not sufficiently suppress occurrence of watermark defects.

INDUSTRIAL APPLICABILITY

The invention thus provides a liquid immersion lithography upper-layer film-forming composition that can form a liquid immersion lithography upper-layer film that exhibits moderate water repellency and high solubility in a developer, and can suppress occurrence of various defects such as watermark defects and bridge defects even if a high scan speed is employed. Therefore, the liquid immersion lithography upper-layer film-forming composition may suitably be used for the production of semiconductor devices that are expected to be further scaled down in the future.

EXPLANATION OF SYMBOLS 1 substrate
2 photoresist pattern
3 8-inch silicon wafer
4 hexamethyldisilazane-treated layer
5 silicon rubber sheet
6 opening
7 ultra-pure water
8 lower-layer antireflective film
9 liquid immersion lithography upper-layer film
10 8-inch silicon wafer
11 photoresist film

The invention claimed is:

1. A photoresist pattern-forming method comprising:
applying a photoresist composition to a substrate to form a photoresist film;
applying a composition to the photoresist film to form a liquid immersion lithography upper-layer film;
exposing the photoresist film and the liquid immersion lithography upper-layer film via an immersion medium and a mask having a given pattern, the immersion medium being disposed between the liquid immersion lithography upper-layer film and a lens; and
developing the photoresist film and the liquid immersion lithography upper-layer film that have been exposed,
wherein the composition comprises:
(A) a polymer that comprises a structural unit (I) shown by formula (1), a structural unit (II) that comprises a sulfo group, and a structural unit (III) shown by formula (3)

(B) a polymer that comprises the structural unit (I) and a structural unit (III) shown by formula (3), and has a fluorine atom content higher than a fluorine atom content of the polymer (A); and
(S) a solvent,

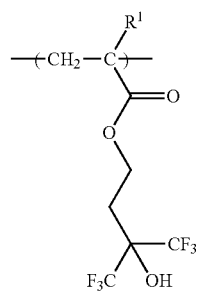

(1)

wherein $R^1$ represents a hydrogen atom, a methyl group, or a trifluoromethyl group,

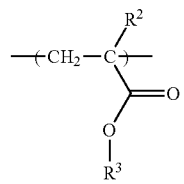

(3)

wherein $R^2$ represents a hydrogen atom, a methyl group, or a trifluoromethyl group, and $R^3$ represents a linear or branched monovalent hydrocarbon group having 1 to 12 carbon atoms or a monovalent alicyclic group having 3 to 20 carbon atoms, provided that at least one hydrogen atom of the hydrocarbon group or the alicyclic group is substituted with a fluorine atom.

2. The photoresist pattern-forming method according to claim 1, wherein the polymer (A) further comprises a structural unit (IV) shown by formula (4),

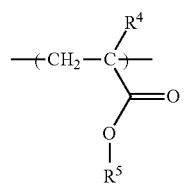

(4)

wherein $R^4$ represents a hydrogen atom, a methyl group, or a trifluoromethyl group, and $R^5$ represents a linear or branched monovalent hydrocarbon group having 1 to 12 carbon atoms or a monovalent alicyclic group having 3 to 20 carbon atoms.

3. The photoresist pattern-forming method according to claim 1, wherein the polymer (B) further comprises includes a structural unit (IV) shown by formula (4),

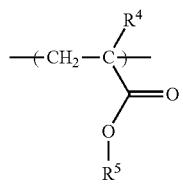

(4)

wherein $R^4$ represents a hydrogen atom, a methyl group, or a trifluoromethyl group, and $R^5$ represents a linear or branched monovalent hydrocarbon group having 1 to 12 carbon atoms or a monovalent alicyclic group having 3 to 20 carbon atoms.

4. The photoresist pattern-forming method according to claim 1, wherein the structural unit (II) comprises a structural unit shown by formula (2-1), a structural unit shown by (2-2), or both,

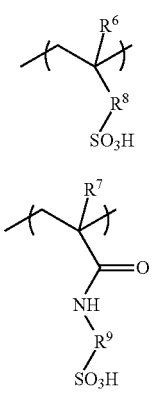

(2-1)

(2-2)

wherein $R^6$ and $R^7$ individually represent a hydrogen atom, a methyl group, or a trifluoromethyl group, and $R^8$ and $R^9$ each individually represent a single bond, a linear or branched divalent hydrocarbon group having 1 to 6 carbon atoms, a divalent alicyclic group having 4 to 12 carbon atoms, or a divalent aromatic hydrocarbon group having 6 to 12 carbon atoms.

5. The photoresist pattern-forming method according to claim 1, wherein a content of the structural unit (I) in the polymer (A) is 20 to 99 mol % based on a total of structural units included in the polymer (A).

6. The photoresist pattern-forming method according to claim 1, wherein a content of the structural unit (II) in the polymer (A) is 1 to 20 mol % based on a total of structural units included in the polymer (A).

7. The photoresist pattern-forming method according to claim 1, wherein a content of the structural unit (III) in the polymer (B) is 5 to 80 mol % based on a total of structural units included in the polymer (A).

8. The photoresist pattern-forming method according to claim 1, wherein the polymer (A) further comprises a structural unit (V) which is shown by formula (5-1) or formula (5-2),

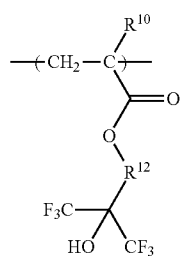

(5-1)

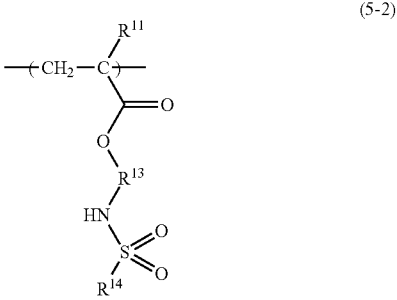

(5-2)

wherein $R^{10}$ and $R^{11}$ each represent a hydrogen atom, a methyl group, or a trifluoromethyl group, $R^{12}$ represents a single bond, a linear or branched alkanediyl group having 1 to 6 carbon atoms which is other than a 1,2-ethylene group, or a divalent alicyclic group having 4 to 12 carbon atoms, $R^{13}$ represents a single bond, a linear or branched alkanediyl group having 1 to 6 carbon atoms, or a divalent alicyclic group having 4 to 12 carbon atoms, and $R^{14}$ represents a linear or branched hydrocarbon group having 1 to 10 carbon atoms or a monovalent alicyclic group having 3 to 10 carbon atoms, provided that at least one hydrogen atom of the hydrocarbon group or the alicyclic group represented by $R^{14}$ is substituted with a fluorine atom.

9. The photoresist pattern-forming method according to claim 1, wherein a content of the polymer (A) in the composition is 20 mass % or more based on a total of polymers included in the composition.

10. The photoresist pattern-forming method according to claim 1, wherein a content of the polymer (A) in the composition is 40 mass % or more based on a total of polymers included in the composition.

11. The photoresist pattern-forming method according to claim 1, wherein a content of the polymer (A) in the composition is 60 mass % or more based on a total of polymers included in the composition.

12. The photoresist pattern-forming method according to claim 1, wherein the composition further comprises (C) a polymer that comprises a structural unit (V) which is shown by formula (5-1) or formula (5-2), and the structural unit (III), the polymer (C) having a fluorine atom content higher than a fluorine content of the polymer (A), (5-1)

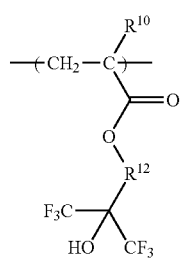

(5-2)

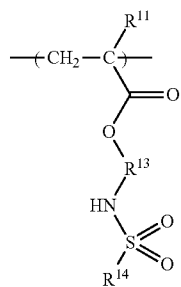

wherein $R^{10}$ and $R^{11}$ each represent a hydrogen atom, a methyl group, or a trifluoromethyl group, $R^{12}$ represents a single bond, a linear or branched alkanediyl group having 1 to 6 carbon atoms which is other than a 1,2-ethylene group, or a divalent alicyclic group having 4 to 12 carbon atoms, $R^{13}$ represents a single bond, a linear or branched alkanediyl group having 1 to 6 carbon atoms, or a divalent alicyclic group having 4 to 12 carbon atoms, and $R^{14}$ represents a linear or branched hydrocarbon group having 1 to 10 carbon atoms or a monovalent alicyclic group having 3 to 10 carbon atoms, provided that at least one hydrogen atom of the hydrocarbon group or the alicyclic group represented by $R^{14}$ is substituted with a fluorine atom.

13. The photoresist pattern-forming method according to claim 12, wherein the polymer (C) further comprises a structural unit (IV) shown by formula (4),

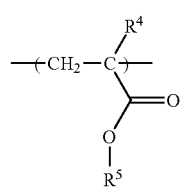

(4)

wherein $R^4$ represents a hydrogen atom, a methyl group, or a trifluoromethyl group, and $R^5$ represents a linear or branched monovalent hydrocarbon group having 1 to 12 carbon atoms or a monovalent alicyclic group having 3 to 20 carbon atoms.

* * * * *